(12) United States Patent
Jung

(10) Patent No.: US 6,430,840 B1
(45) Date of Patent: Aug. 13, 2002

(54) METHOD OF AND APPARATUS FOR DRYING A WAFER USING ISOPROPYL ALCOHOL

(75) Inventor: Jae-Hyung Jung, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/801,636

(22) Filed: Mar. 9, 2001

(30) Foreign Application Priority Data

Aug. 3, 2000 (KR) ........................................ 2000-44984

(51) Int. Cl.$^7$ ................................................. F26B 3/00
(52) U.S. Cl. ............................ 34/468; 34/74; 34/408; 34/409; 34/410; 34/412; 34/443; 34/467; 134/11; 134/30; 134/31; 134/95.1; 134/902
(58) Field of Search ................................ 34/92, 73, 74, 34/329, 408, 409, 410, 412, 418, 423, 443, 467, 468, 516; 134/2, 10, 11, 25.4, 30, 31, 32, 37, 95.1, 114, 902

(56) References Cited

U.S. PATENT DOCUMENTS 4,911,761 A * 3/1990 McConnell ................. 134/11
5,951,779 A * 9/1999 Koyanagi ..................... 134/2
6,029,371 A * 2/2000 Kamikawa ................. 34/516
6,050,275 A * 4/2000 Kamikawa ................ 134/105
6,123,900 A * 9/2000 Vellutato ..................... 422/22

FOREIGN PATENT DOCUMENTS

| JP | 8-61846 | 3/1996 |
| JP | 9-213672 | 8/1997 |
| JP | 10-22257 | 1/1998 |
| JP | 10-154689 | 6/1998 |
| JP | 11-87305 | 3/1999 |

* cited by examiner

Primary Examiner—Ira S. Lazarus
Assistant Examiner—Kathryn S. O'Malley
(74) Attorney, Agent, or Firm—Volentine Francos, PLLC

(57) ABSTRACT

A method of and an apparatus for drying a wafer using the Marangoni effect quickly forms an isopropyl alcohol layer on a cleaning liquid in which the wafer is submerged. The isopropyl alcohol is first heated and then supplied in a fluid state onto the cleaning liquid. The isopropyl alcohol liquid thus diffuses rapidly to form the isopropyl alcohol layer. The wafer is thoroughly dried by removing it from the cleaning liquid through the isopropyl alcohol while only supplying more of the heated nitrogen gas into the ambient above the cleaning liquid.

14 Claims, 17 Drawing Sheets

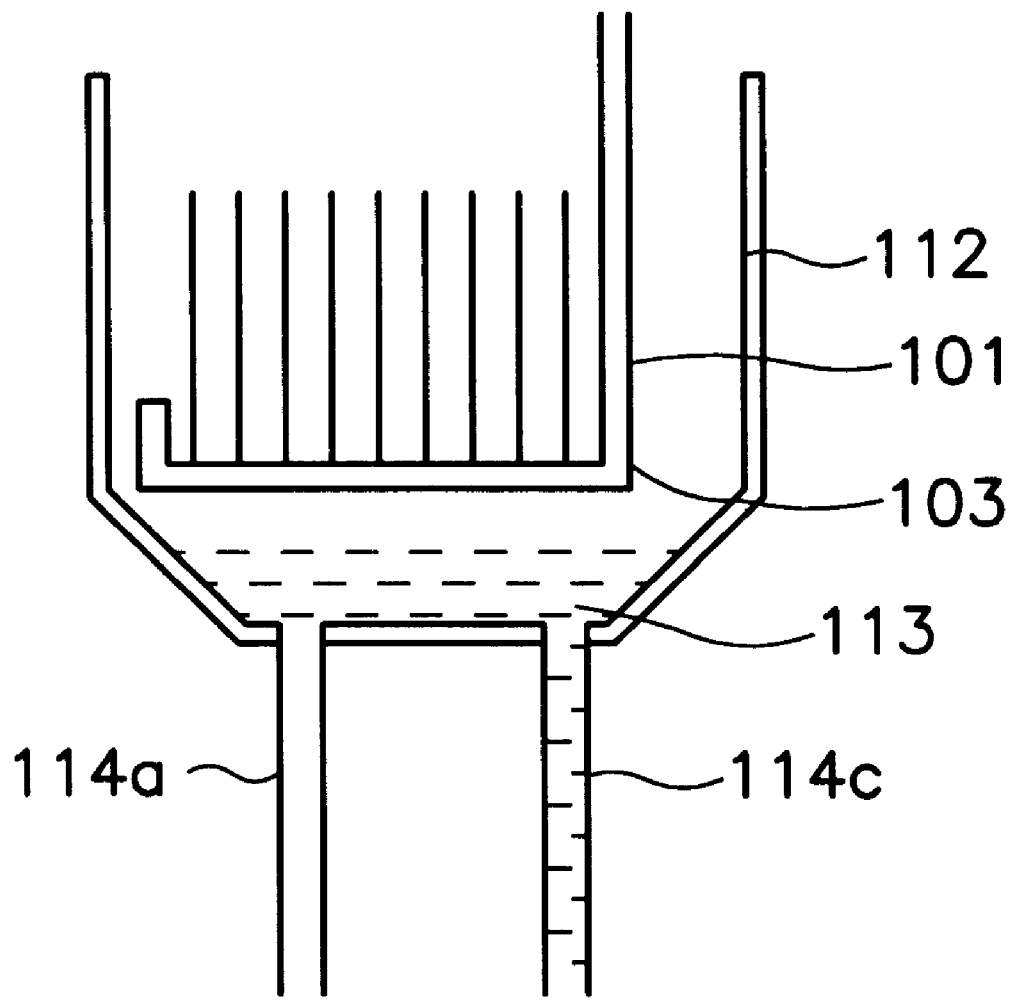

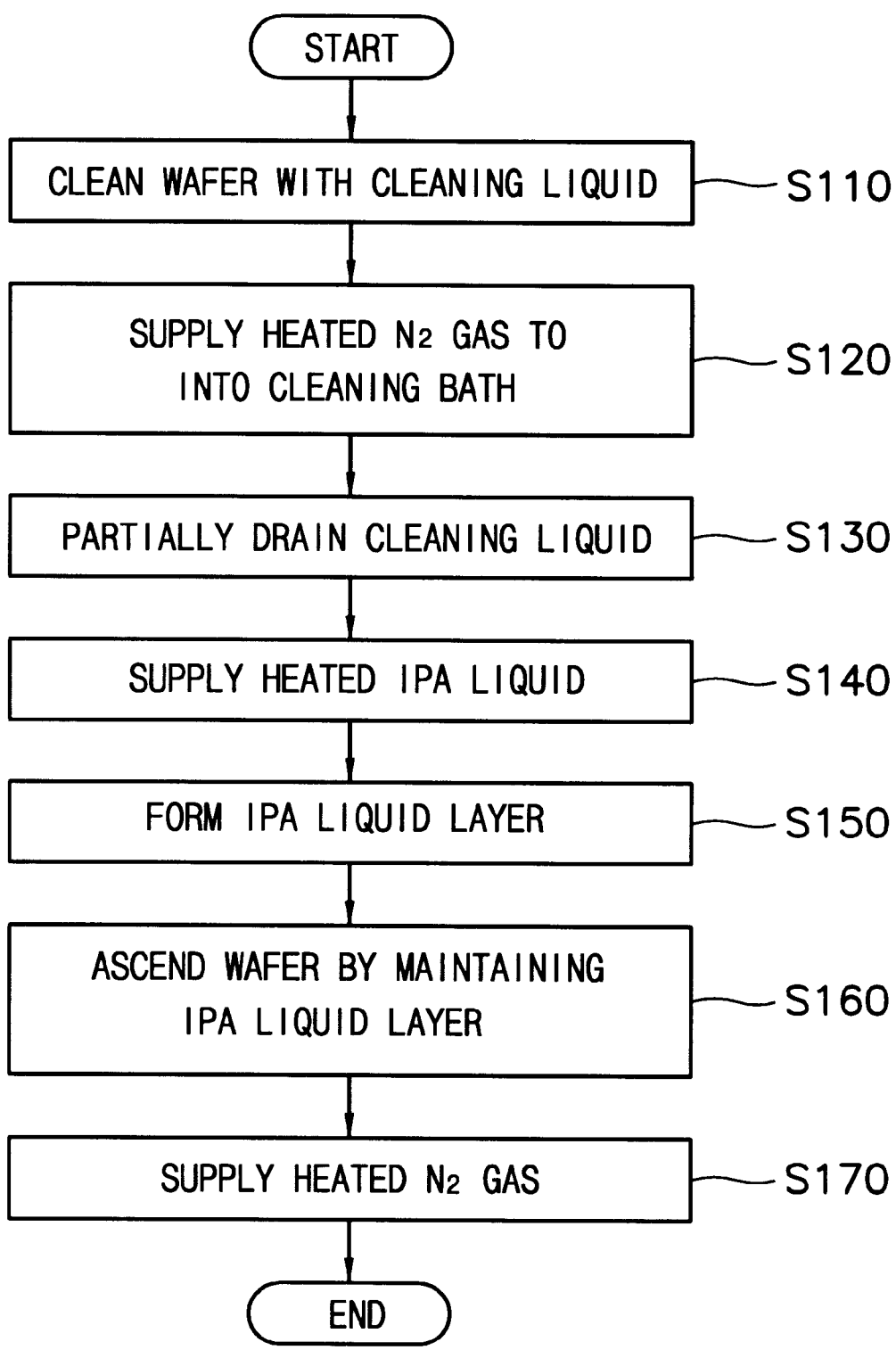

METHOD OF AND APPARATUS FOR DRYING A WAFER USING ISOPROPYL ALCOHOL

BACKGROUND OF THE INVENTION

1. Field of the Invention

The present invention relates to a method of and an apparatus for drying a wafer. More particularly, the present invention relates to a method of and an apparatus for drying a wafer using isopropyl liquid after the wafer is cleaned following a semiconductor manufacturing process.

2. Description of the Related Art

Semiconductor devices or semiconductor chips are manufactured by processing a wafer that is usually formed of silicon. The wafer is typically subjected to a series of semiconductor device manufacturing processes such as photolithography, chemical or physical vapor deposition and plasma etching.

After executing these processes, foreign material such as chemicals or dust remains on the surface of the wafer. In order to assure the quality of the semiconductor devices, the foreign material must be removed from the surface of the wafer. The cleaning process used to remove the foreign material involves both washing and drying the wafer.

In particular, the wafer may be washed using de-ionized water (hereinafter referred to as "DIW"). Because the DIW will eventually dissolve the silicon, the wafer must be completely dried after being washed with the DIW or else water spots will be formed.

In addition, a method of using isopropyl alcohol to enhance the drying of a wafer has been developed. For example, Japanese Patent Laid-Open Publication No. Hei 8-61846 discloses a method of directly spraying liquid isopropyl alcohol over a wafer, forming a mixture of the water and the isopropyl alcohol on the surface of the wafer, and volatilizing the mixture by means of a high temperature nitrogen gas. In addition, U.S. Pat. No. 6,029,371 issued to Kamikawa et al. discloses a method of drying a wafer by directly spraying a washed wafer with a drying gas comprising heated isopropyl alcohol and nitrogen.

Also, drying apparatuses using isopropyl alcohol are disclosed in U.S. Pat. No. 5,634,978 issued to Mohindra et al., U.S. Pat. No. 5,855,077 issued to Chang-Hyun Nam et al., U.S. Pat. No. 4,633,893 issued to McConnell et al., and U.S. Pat. No. 4,911,761 also issued to McConnell et al. These drying apparatuses execute a method in which the isopropyl alcohol is introduced as a mist over the cleaned wafer to eliminate the water on the wafer.

FIG. 1 shows one example of a conventional apparatus 100 that works on the Marangoni effect to dry the wafer using an isopropyl alcohol mist. The apparatus 100 includes a cleaning section (or a rinsing section) 110 containing a cleaning liquid (or rinsing liquid) 113 for cleaning (or rinsing) the wafer. The cleaning section 110 in turn includes an inner bath 112 having an upper open end, and an outer bath 116 covered with a lid 117. The outer bath 116 and lid 117 enclose the inner bath 112. A wafer 101 is immersed in the cleaning liquid 113 of the inner bath 112 for cleaning. Once the cleaning liquid 113 over-flows the inner bath 112, the over-flown cleaning liquid 113a gathers in the outer bath 116 from where it is drained from the cleaning section 110.

A cleaning liquid supply tube line 114a is connected to the inner bath 112 at the bottom thereof. First and second cleaning liquid drain tube lines 114b and 114c are connected to the inner bath 112 and the outer bath 116, respectively, at the bottoms thereof. The cleaning liquid supply tube line 114a supplies the cleaning liquid 113, such as DIW, to the inner bath 112. The first cleaning liquid drain tube line 114b drains the cleaning liquid 113a which has over-flown the inner bath 112 into the outer bath 116. The second cleaning liquid drain tube line 114c gradually drains the cleaning liquid 113 from within the inner bath 112.

The apparatus 100 for drying the wafer is also equipped with an isopropyl alcohol mist supply tube line 134 for supplying the isopropyl alcohol mist from an isopropyl alcohol supply unit (not shown). The isopropyl alcohol supply unit makes the isopropyl alcohol bubble by using nitrogen as a carrier gas to form the isopropyl alcohol mist. Then, the isopropyl alcohol mist and nitrogen are supplied to the upper portion of the outer bath 116 via the isopropyl alcohol mist supply tube line 134. A diffuser 136 is furnished at the central portion of the lid 117 of the outer bath 116 for consistently diffusing the isopropyl alcohol mist and nitrogen throughout the inside of the outer bath 116.

In addition, a nitrogen gas supply tube line 140 is connected to the lid 117 for supplying heated nitrogen gas into the outer bath 116 during the drying process to create a drying ambient.

The conventional apparatus 100 for drying a wafer operates as follows.

Once a wafer guide 103 loaded with wafers 101 is seated within the inner bath 112, the cleaning liquid 113, such as the DIW, is supplied to the inner bath 112 via the cleaning liquid supply tube line 114a to initiate the cleaning operation. The cleaning liquid is supplied into the inner bath 112 at such a rate that it overflows the inner bath 112 during the cleaning operation. The over-flown cleaning liquid 113a is gathered in the outer bath 116 and drained from the bottom of the outer bath 116 via the first cleaning liquid drain tube line 114b.

Once the cleaning operation is complete, the process of drying the wafer 101 begins. FIGS. 2A, 2B and 2C are schematic diagrams illustrating the drying process.

Referring to FIG. 2A, after the cleaning process is complete, the nitrogen gas and the isopropyl alcohol mist entrained thereby are introduced via the isopropyl supply tube line 134 and diffuser 136 into the upper portion of the outer bath 116. Thus, the ambient in outer bath 116 is converted into a drying ambient. At this time, approximately 50 cc of the isopropyl alcohol mist is supplied. Also, at this time, the heated nitrogen gas is supplied into the outer bath 116 via the nitrogen gas supply tube line 140 connected to the lid 117.

Referring to FIG. 2B, the cleaning liquid 113 is drained via the drain tube line 114c while the nitrogen gas is supplied via the nitrogen gas supply tube line 140. At this time, the cleaning liquid 113 is drained at a constant rate via the second drain tube line 114c. The height of the cleaning liquid 113 is decreased at a rate of about 3 mm/sec. During the draining operation, the water spots on the wafers 101 are eliminated by means of the Marangoni effect created by the isopropyl alcohol. Referring to FIG. 2C, once the cleaning liquid 113 is completely drained to a level below the wafers 101, the last of the heated nitrogen gas is introduced into the outer bath 116 via the nitrogen supplying tube line 140, thereby completing the drying process.

In addition to this conventional method, Japanese Patent Laid-Open Publication Nos. Hei 11-87305, Hei10-154689 and Hei10-22257 disclose methods of drying a wafer in which an isopropyl alcohol mist is used. In these methods, an isopropyl alcohol liquid layer is formed by the mist over a cleaning liquid, and the wafers are raised from the cleaning liquid into the isopropyl alcohol liquid layer, thereby drying the wafer.

According to all of these heretofore known methods, the mist of isopropyl alcohol is supplied to the outer bath using nitrogen as a carrier gas. Therefore, the amount of isopropyl alcohol injected into the outer bath is determined by measuring the reduction in the amount of isopropyl alcohol in the isopropyl alcohol supply unit. For this reason, the amount of isopropyl alcohol used for forming the isopropyl alcohol layer cannot be accurately determined. Furthermore, it is difficult to accurately control the amount of isopropyl alcohol being supplied.

Moreover, the isopropyl alcohol sprayed by the diffuser adheres to the side wall of the outer bath. In this case, the isopropyl alcohol is likely to fall as drops onto the wafer. These drops create wafer defects.

Additionally, a large amount of time is required to form from the mist a sufficient layer of isopropyl alcohol above the cleaning liquid within the inner bath for producing the Marangoni effect. The overall processing time is thus significant. Moreover, such a mist is likely to be exhausted if the outer bath is not completely sealed.

In view of these problems of the conventional art, a method has been proposed in which the isopropyl alcohol liquid is supplied directly onto the upper portion of the cleaning liquid. For example, Japanese Patent Laid-open No. Hei 9-213672 discloses a method in which an isopropyl alcohol layer is formed over a cleaning liquid in which a wafer is immersed, and the wafer is dried while ascending from the cleaning liquid. In this method, the isopropyl alcohol layer formed on the cleaning liquid has a thickness of about 5 mm, and the wafer is to raised gradually from the cleaning liquid.

However, the above-described method requires a large quantity of isopropyl alcohol and a relatively long amount of time for forming the isopropyl alcohol liquid layer. Also, the drying effect produced by this method is so insufficient that water spots remain after the wafer is cleaned. The water spots leave too many particles on the wafer.

SUMMARY OF THE INVENTION

Therefore, the object of the present invention is to overcome the above-described drawbacks of the conventional prior art.

More specifically, a first object of the present invention is to provide a highly effective and time-efficient method of drying a wafer using the Marangoni effect. A second object of the present invention is to provide an apparatus for drying a wafer particularly suitable for performing such a method.

To achieve the first object, the present invention provides a method of drying an object comprising supplying heated inert gas over a cleaning liquid in which the object is immersed, heating a liquid having a smaller surface tension than that of the cleaning liquid, and then supplying the heated liquid onto the cleaning liquid in a fluid state. This forms a liquid layer on the cleaning liquid, and an ambient over the cleaning liquid comprising the vapor of the heated liquid and the inert gas. Then, the object is removed from the cleaning liquid while the heated liquid layer is maintained. The object is dried further by supplying more of the heated inert gas into the ambient surrounding the object.

The heated inert gas is preferably nitrogen gas, and the liquid used to form a layer on the cleaning liquid is preferably isopropyl alcohol.

To achieve the second object, the present invention provides a cleaning apparatus comprising a cleaning section housing the cleaning liquid for cleaning the object, and an isopropyl alcohol supplying unit that supplies heated liquid isopropyl alcohol onto the cleaning liquid to form an isopropyl alcohol liquid layer and an isopropyl alcohol ambient over the cleaning liquid, and a nitrogen supply unit that supplies heated nitrogen gas above the cleaning liquid housed in the cleaning section. A separating unit can remove the object from the cleaning liquid while the isopropyl alcohol layer is maintained.

According to the present invention, to dry the object such as a wafer, the nitrogen gas is heated and supplied into the cleaning section at a location above the cleaning liquid in which the wafer is immersed, and the liquid isopropyl alcohol liquid is heated and supplied directly onto the cleaning liquid. The isopropyl alcohol liquid layer diffuses quickly to form a liquid layer on the cleaning liquid, the liquid isopropyl alcohol liquid supplied in the fluid state also forms an ambient with the nitrogen gas that is non-volatile above the cleaning liquid. The wafer is dried only by removing it from the cleaning liquid into the ambient while only the heated nitrogen gas continues to be supplied.

BRIEF DESCRIPTION OF THE DRAWINGS

The above and other objects, features and advantages of the present invention will become more apparent by referring to the following detailed description of the preferred embodiments thereof made with reference to the attached drawings, of which:

FIGS. 2A to 2C are schematic diagrams of cleaning sections of the conventional drying apparatus, illustrating a drying process executed by the conventional apparatus;

FIG. 13 is a flowchart of the second embodiment of a method of drying a wafer according to the present invention, which method can be performed by the apparatus shown in FIG. 12.

DETAILED DESCRIPTION OF THE PREFERRED EMBODIMENTS

The preferred embodiments of the present invention will be described in detail hereinafter with reference to accompanying drawings.

Embodiment 1

Figure 3:
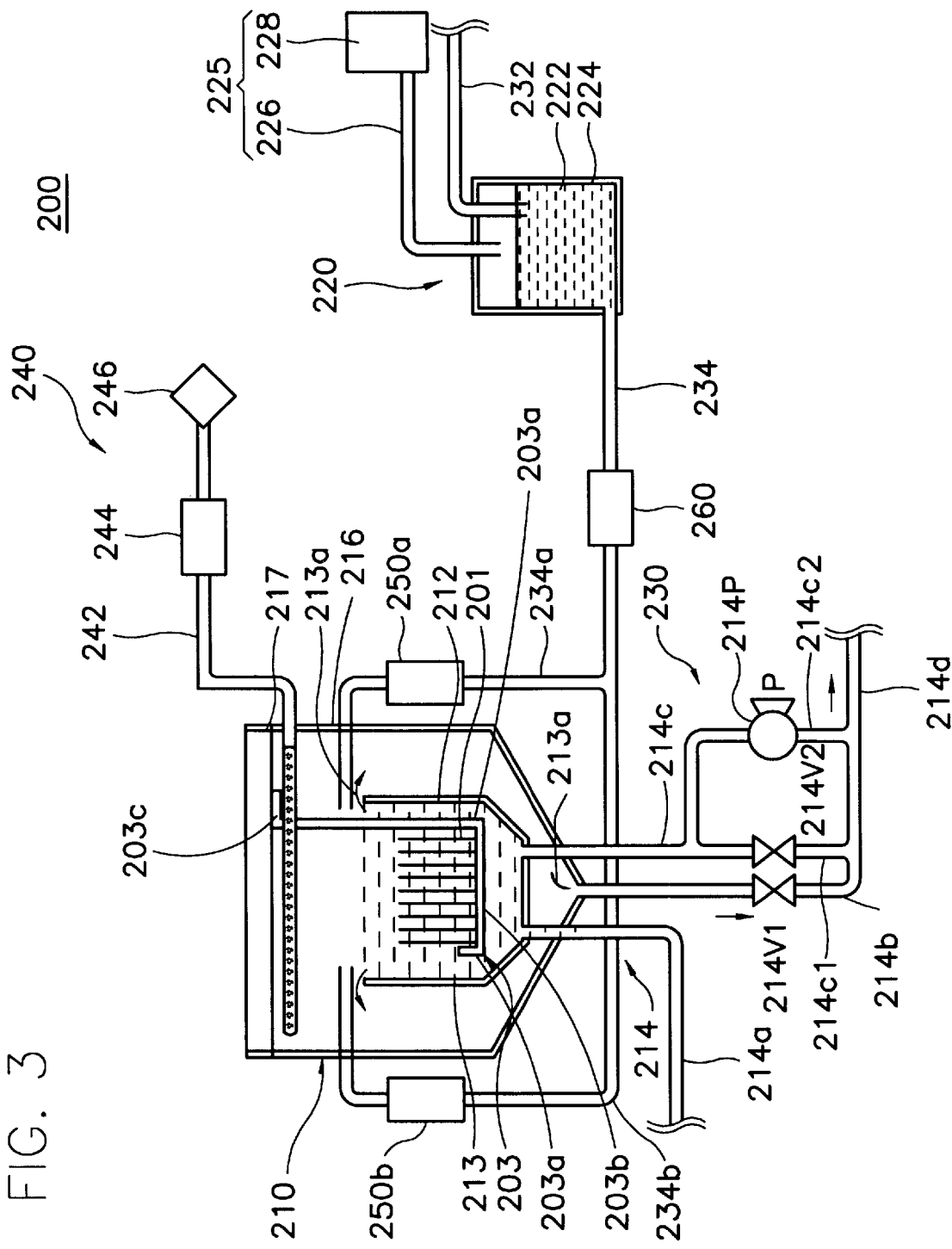
FIG. 3 is a schematic diagram of a first embodiment of an apparatus for drying a wafer according to the present invention.

FIG. 3 shows a first embodiment of an apparatus 200 for drying a wafer according to the present invention.

The drying apparatus 200 includes a cleaning section 210 containing a cleaning liquid 213 for cleaning wafers 201. DIW may be used as the cleaning liquid 213. The cleaning section 210, in turn, comprises an inner bath 212 in which the wafers 201 are immersed in the cleaning liquid 213 to be cleaned, and an outer bath 216 enclosing the inner bath 212. The wafers 201 are loaded on a wafer guide 203 that can be seated in the cleaning bath 210. The wafer guide 203 comprises two opposing guide plates 203a, three guide rods 203b (see FIG. 4) fixed between the guide plates 203a, and a guide arm 203c extending upwardly from one of the guide plates 203a. The guide arm 203c has a horizontally extending portion at the top thereof to facilitate the handling of the wafer guide 203.

The top of the inner bath 212 is open. The outer bath 216 is covered with a lid 217. Any of the cleaning liquid that overflows the inner bath 21 is gathered in the outer bath 216. From there, the over-flown cleaning liquid 213a is drained from the cleaning section 210. The lower portion of the outer bath 216 is preferably funnel-shaped to facilitate the draining of the cleaning liquid 213a.

Cleaning liquid lines 214 for supplying and draining the cleaning liquid 213 are connected to the bottom of the inner bath 212. Of these lines 214, a cleaning water supply tube line 214a constitutes a cleaning water supply unit that supplies the cleaning liquid to the inner bath 212 from a cleaning water supply source (not shown).

A cleaning water draining unit 230 includes an outer bath cleaning water drain tube line 214b and an inner bath cleaning water drain tube line 214c. One end of the outer bath cleaning water drain tube line 214b is connected to the funnel-shaped bottom of the outer bath 216, and the other end thereof is connected to a common drain tube line 214d. A first drain valve 214V1 is provided in-line with the outer bath cleaning water drain tube line 214b. The inner bath cleaning water drain tube line 214c extending from the bottom of the inner bath 212 branches into a first inner bath cleaning water drain tube line 214c1 and a second inner bath cleaning water drain tube line 214c2. The first inner bath cleaning water drain tube line 214c1 and the second inner bath cleaning water drain tube line 214c2 are connected to the common drain tube line 214d.

Moreover, a second drain valve 214V2 is provided in-line with the first inner bath cleaning water drain tube line 214c1, and a draining pump 214P is provided in-line with the second inner bath cleaning water draining tube line 214c2.

The drying apparatus 200 also includes an isopropyl alcohol supply unit 220 for supplying isopropyl alcohol to the cleaning section 210. More specifically, the isopropyl alcohol supply unit 220 supplies heated isopropyl alcohol liquid onto the cleaning liquid 213 to form an isopropyl alcohol liquid layer on the cleaning liquid 213. Isopropyl alcohol as a liquid has a surface tension that is smaller than that of the cleaning liquid. The heated isopropyl alcohol liquid is also partially volatilized to form an isopropyl alcohol ambient at the upper portion of the outer bath 216, i.e., over the cleaning liquid 213. In addition, the isopropyl alcohol supply unit 220 is preferably operated to supply the cleaning section with isopropyl alcohol vapor while the cleaning liquid 213 is being drained to thereby maintain the ambient of isopropyl alcohol in the cleaning section 210.

The isopropyl alcohol supply unit 220 includes an isopropyl alcohol tank 224 partially filled with liquid isopropyl alcohol 222. The tank 224 is connected to an isopropyl alcohol supply tube line 232 by which the tank 224 is continuously supplied with isopropyl alcohol liquid.

Also, a pressurizing unit 225 is provided at the upper portion of the tank 224 for pressurizing the isopropyl alcohol liquid 222. To this end, the pressurizing unit 225 may exert hydraulic pressure or pneumatic pressure on the isopropyl alcohol liquid 222. However, in the preferred embodiment of the present invention, the pressurizing unit 225 employs nitrogen gas to pressurize the isopropyl alcohol liquid. In this case, the pressurizing unit 225 includes a nitrogen gas supply tube line 226 and a nitrogen gas supply source 228. Alternatively, the pressurizing unit 225 may employ an inert gas such as argon or helium instead of nitrogen.

One end of the nitrogen gas supply tube line 226 is connected with a nitrogen gas supply source 228, and the other end thereof is disposed over the isopropyl alcohol liquid 222. The nitrogen gas supplied from the nitrogen gas supply source 228 via the nitrogen gas supplying tube line 226 exerts pressure on the surface of the isopropyl alcohol liquid 222. Such pressure causes the isopropyl alcohol liquid 222 to be forced from the tank 224.

The isopropyl alcohol liquid 222 is supplied to the upper portion of inner bath 212 via an isopropyl alcohol supply tube line 234. One end of the isopropyl alcohol supply tube line 234 is connected to the isopropyl alcohol tank 224. From there, the isopropyl alcohol supplying tube line 234 branches into a first isopropyl alcohol supply tube line 234a and a second isopropyl alcohol supply tube line 234b. The outlets of the first and second supply tube lines 234a and 234b are disposed over the inner bath 212 of the cleaning section 210. First and second supply tube lines 234a and 234b, as in this embodiment, are preferable in terms of their ability to supply the isopropyl alcohol efficiently to the inner bath 212, and to form a layer of isopropyl alcohol liquid uniformly on the cleaning liquid, etc. However, the isopropyl alcohol supply tube line 234 may nonetheless extend to the upper portion of the inner bath 212 without being branched or may branch into three or more supply tube lines within the purview of the present invention.

Figure 4:
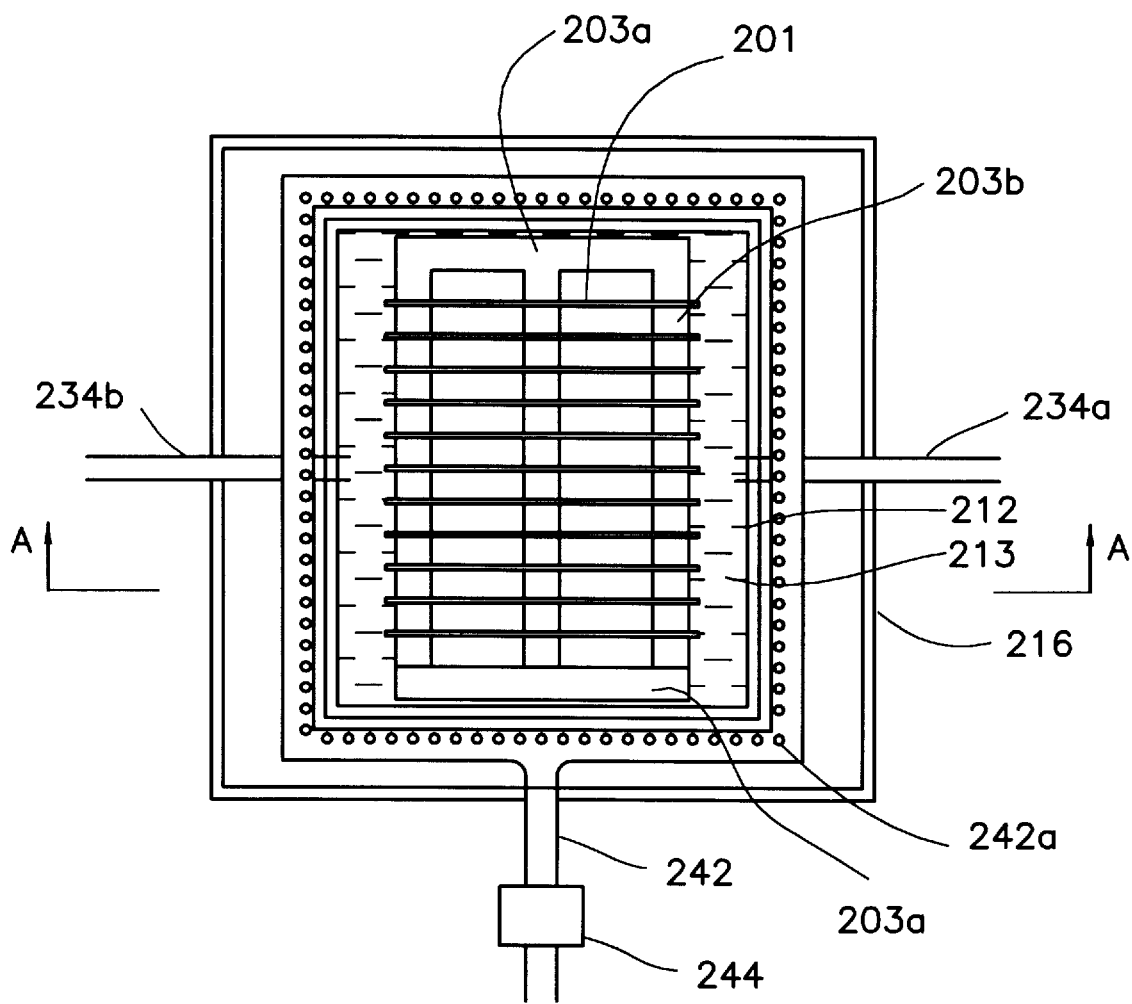
FIG. 4 is top view of a cleaning section of the drying apparatus showing the arrangement of a nitrogen gas supply tube line and first and second isopropyl alcohol supply tube lines relative to a bath of the cleaning section.

In addition, FIG. 3 shows the isopropyl alcohol liquid being supplied into the inner bath from the front and rear directions of the wafer guide 203. However, this is shown in the drawing for the sake of simplicity. Actually, the isopropyl alcohol liquid is preferably introduced into the inner bath 211 from the right and left sides of the wafer guide 203 as shown in FIG. 4.

First and second heaters 250a and 250b are disposed around the outlets of the first and second supply tube lines 234a and 234b, i.e., adjacent locations where the first and second supply tube lines 234a and 234b enter the outer bath 216. The first and second heaters 250a and 250b heat the isopropyl alcohol liquid 222 flowing through the first and second supply tube lines 234a and 234b so that heated isopropyl alcohol liquid 222 is supplied to the inner bath 212.

The temperature of the first and second heaters 250a and 250b is set to be higher than 50° C. and lower than the boiling point of isopropyl alcohol (approximately 83° C. at atmospheric pressure). Preferably, the temperature of the first and second heaters 250a and 250b is set to be about 60~70° C. Thus, the isopropyl alcohol liquid enters the cleaning section 210 at a temperature of about 40~70° C., preferably at about 50~60° C. If the temperature of the first and second heaters 250a and 250b were lower than 50° C., the isopropyl alcohol entering the cleaning section 210 would be unsuitable for forming the isopropyl alcohol ambient. On the other hand, if the temperature of the first and second heaters 250a and 250b were higher than the boiling point of isopropyl alcohol, the isopropyl alcohol would enter the cleaning section 210 while boiling.

Next, a flow control meter 260 is disposed in-line with the isopropyl alcohol supply tube line 234 upstream of the first and second supply tube lines 234a and 234b. The flow control meter 260 allows only a constant amount of isopropyl alcohol liquid 222 to flow for a prescribed time period through the isopropyl alcohol supply tube line 234 so that a proper amount of the isopropyl alcohol liquid 222 is supplied to the inner bath 212.

For example, in order to satisfactorily dry a silicon wafer having a diameter of 300 mm, for example, the isopropyl alcohol liquid layer formed on the cleaning liquid 213 should have a thickness of approximately 1~3 mm, preferably 1.5~2.5 mm, for about 4 seconds. If the thickness of the liquid layer of isopropyl alcohol is less than about 1 mm or larger than 3 mm, too many particles will remain on the wafer after the drying process. Therefore, the flow meter 260 regulates the flow of the isopropyl alcohol to such a rate that the isopropyl alcohol liquid layer formed on the cleaning liquid 213 acquires a thickness within the desired range.

The drying apparatus 200 of the present invention also includes a nitrogen gas supply unit 240 comprising a nitrogen gas supply tube line 242 and a nitrogen gas supply source 246. One end of the nitrogen gas supply tube line 242 is connected to the nitrogen gas supplying tube line 246, and an outlet thereof is disposed at the upper portion of the outer bath 216.

FIG. 4 shows the arrangement of the nitrogen gas supply tube line 242 and the first and second isopropyl alcohol supply tube lines 234a and 234b with respect to the cleaning section 210. Note, though, the outlet of the nitrogen gas supply tube line 242 is disposed at a level above the outlets of the first and second isopropyl alcohol supply tube lines 234a and 234b relative to the outer bath 216. Furthermore, the nitrogen gas supply tube line 242 has a plurality of holes 242a that allow the nitrogen gas to be supplied uniformly throughout the upper portion of the outer bath 216.

A heater 244 for heating the nitrogen gas is provided in-line with the nitrogen gas supply tube line 242 upstream of the outer bath 216. The temperature of the heater 244 is controlled so that the nitrogen gas entering the cleaning section 210 produces a suitable nitrogen gas ambient. To this end, the nitrogen gas should have a temperature of about 70~90° C., and more preferably, a temperature of about 80° C. To heat the nitrogen gas to such a temperature, considering the initial temperature and flux of the nitrogen gas supplied from nitrogen gas supply source 246, the heater 244 must be regulated to have a temperature in the range of 100~200° C., and preferably to be about 150° C.

The method of cleaning the wafer according to the present invention using the above-described apparatus 200 shown in FIG. 3 will now be described with reference to FIGS. 4, 5A–5D, 6 and 7.

Figure 5A:
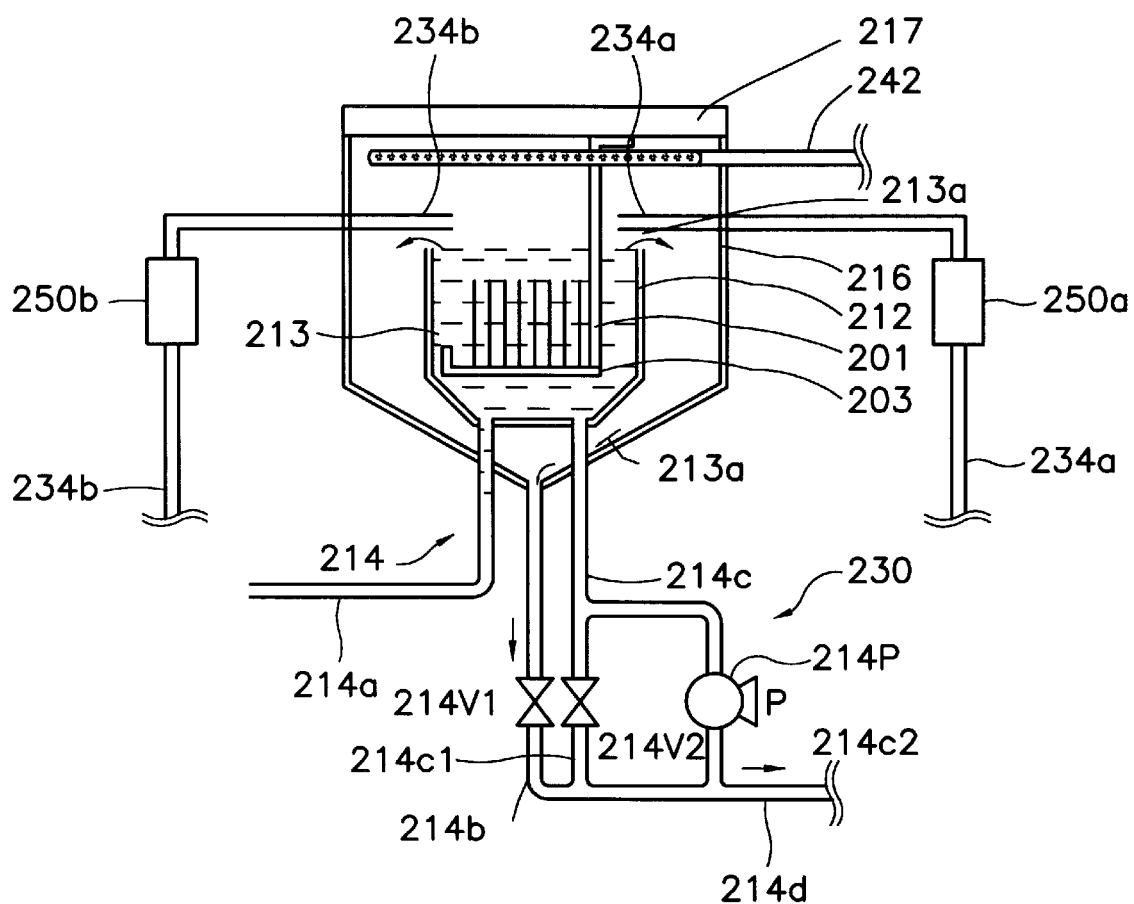
FIGS. 5A to 5D are respective side views of the cleaning section, illustrating a first embodiment of a method of drying a wafer according to the present invention.
Figure 7:
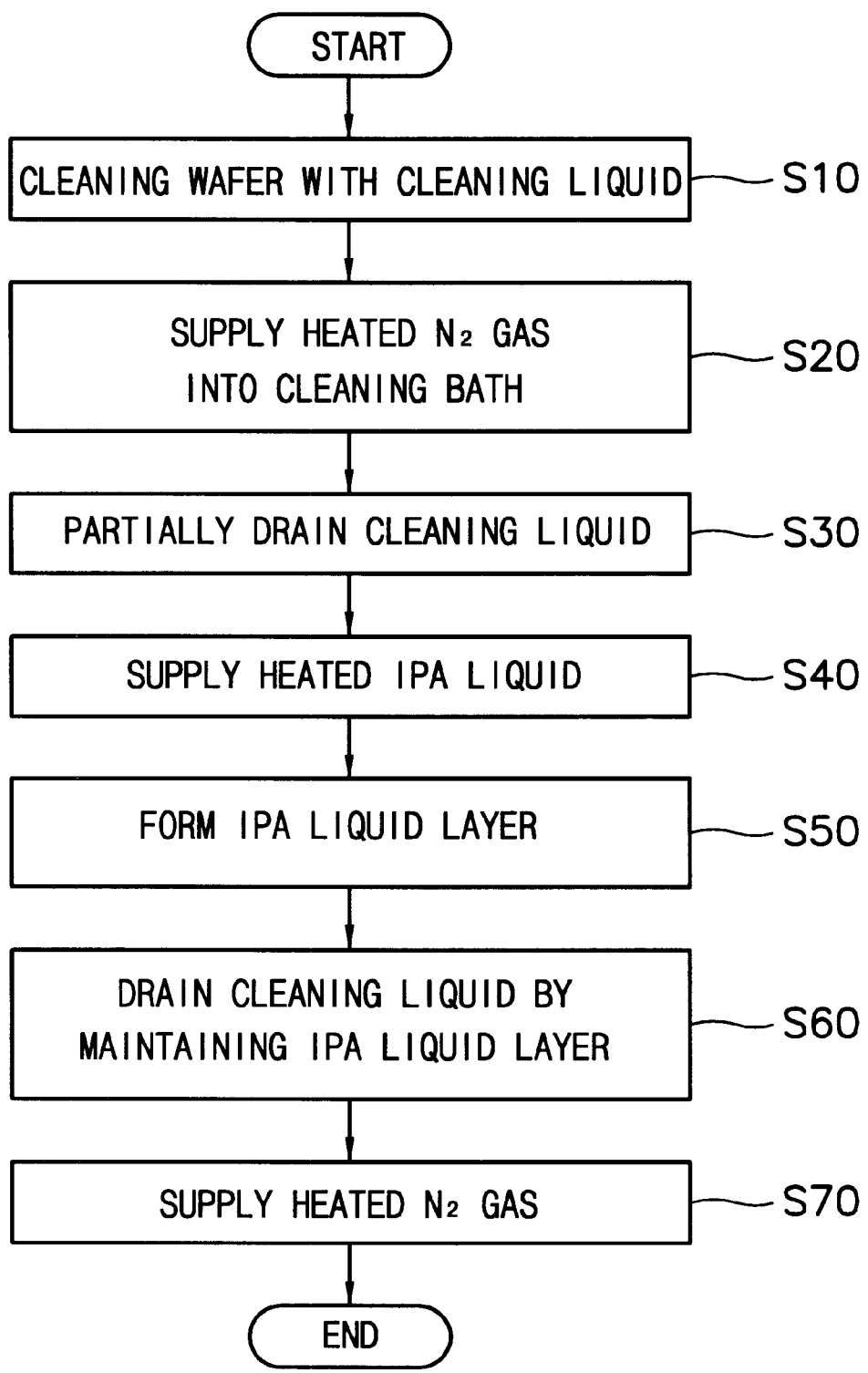
FIG. 7 is a flowchart of the first embodiment of the method of drying a wafer according to the present invention.
Figure 8:
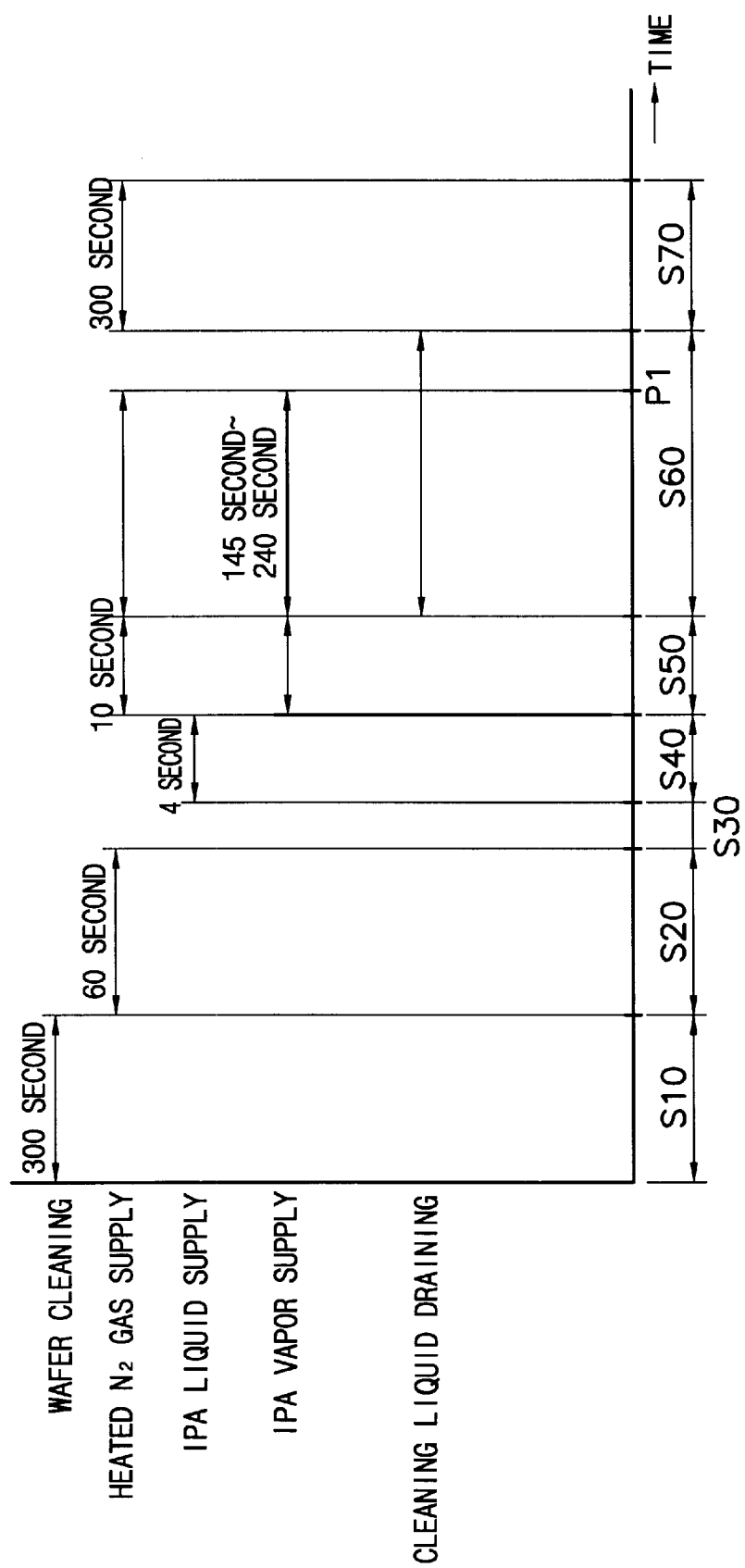
FIG. 8 is a timing chart of the first embodiment of the method for drying the wafer according to the present invention.

Referring first to FIGS. 4 and 5A, the wafer guide 203 loaded with the wafers 201 is placed into the inner bath 212 in the direction of arrows A—A in FIG. 4. Then, the cleaning liquid 213, such as DIW, is supplied to the inner bath 212 via the cleaning water supply tube line 214a. During a washing operation, the cleaning liquid 213 is continuously supplied from the lower portion of the inner bath 212 so that the cleaning liquid 213 overflows the inner tub 212. The overflown cleaning liquid 213a gathers in the funnel-shaped lower portion of the outer bath 216, and is drained therefrom via the first cleaning liquid draining tube line 214b and the common drain tube line 214d. At this time, the first drain valve 214V1 in the first drain tube line 214b is obviously open. As shown in FIGS. 7 and 8 (step S10), the wafer is washed using the DIW for about 300 seconds.

Figure 5B:
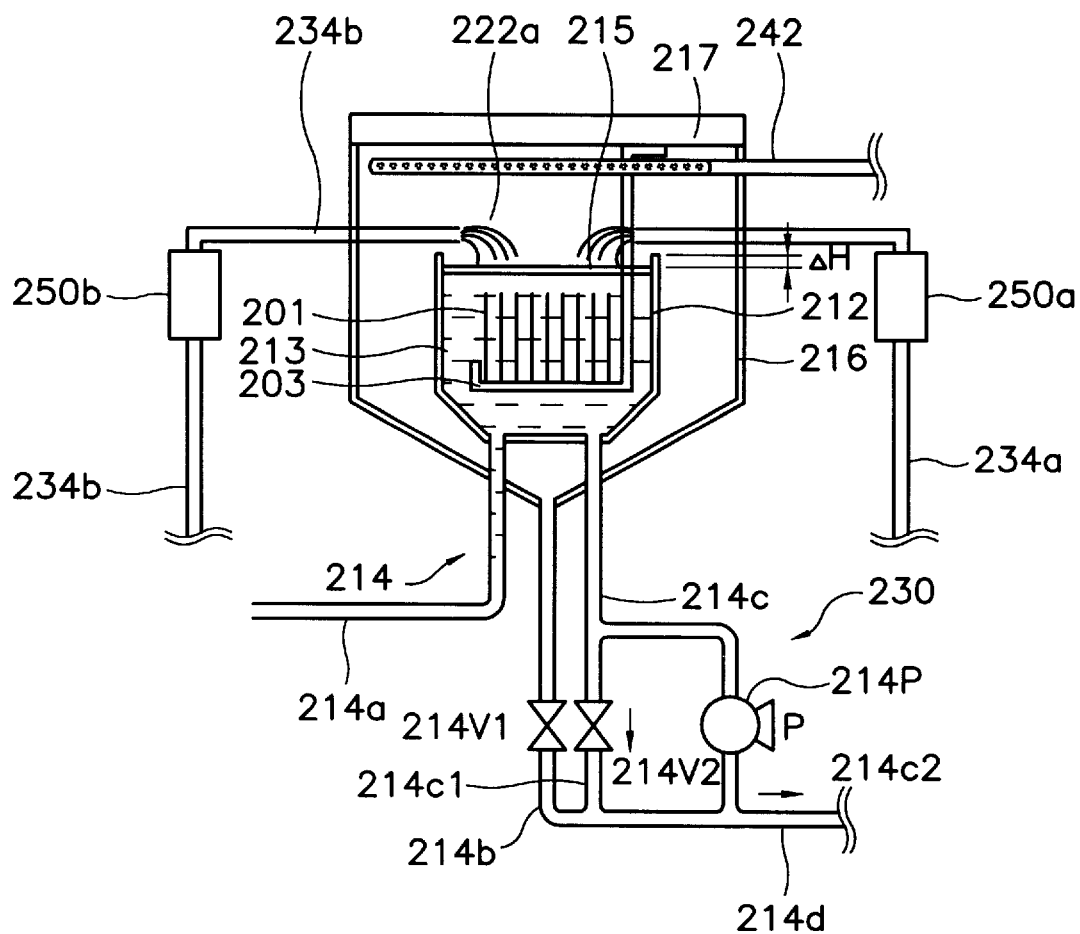

Once the washing process is completed, the drying process of the wafer 201 begins. Referring to FIG. 5b, nitrogen gas is supplied from the nitrogen gas supply source 246 into the outer bath 216 to create a nitrogen gas ambient within the outer bath 216. Specifically, the nitrogen gas supplied from the nitrogen gas supply source 246 passes through the nitrogen gas supply tube line 242, whereby it is heated by heater 244 to approximately 70~90° C., and preferably to about 80° C. The heated nitrogen gas enters the upper portion of the outer bath 216 via the holes 242a in the nitrogen gas supply tube line 242 such that the nitrogen gas ambient is uniform throughout the inside of outer bath 216. As shown in FIG. 7, the supplied nitrogen gas maintains a pressure of 2~4 kg/cm$^2$, and preferably 3 kg/cm$^2$. (step S20)

Thereafter, the second drain valve 214V2 disposed in the first inner bath drain tube line 214c1 is opened for a short time period to drain some of the cleaning liquid 213, whereby the water level of the cleaning liquid 213 in the inner bath 212 drops slightly. Alternatively, the drain pump 214P in the second inner bath drain tube line 214c2 may be operated to drain the cleaning liquid 213. Then, the second drain valve 214V2 is closed (or the pump 214P is turned off) before the wafers 201 are exposed. The difference in water level ΔH of the cleaning liquid 213 during this process (step S30) is preferably approximately 5 mm.

Thereafter, heated isopropyl alcohol liquid 222a is supplied to the inner bath 212 (step S40). As shown in FIG. 3, nitrogen gas under pressure is supplied from the nitrogen gas supply source 228 to the isopropyl alcohol tank 224 via the nitrogen gas supply tube line 226. The nitrogen gas exerts pressure on the surface of the isopropyl alcohol liquid 222 in the tank 224. Accordingly, the isopropyl alcohol liquid 222 is forced from the tank and into isopropyl alcohol supply tube line 234. The isopropyl alcohol liquid 222 is introduced into the cleaning bath 210 at a constant rate due to the flow control meter 260. The amount of liquid isopropyl alcohol 222a allowed to flow into the inner bath 212 is sufficient to form an isopropyl alcohol liquid layer 215 having a thickness of 1~3 mm, and preferably about 2.1 mm, on the cleaning liquid 213. Although the total amount of the isopropyl alcohol 222a admitted into the inner bath 212 depends on the surface area of the cleaning liquid 213, i.e., the size of the inner bath 212, the thickness of the isopropyl alcohol liquid layer 215 is independent thereof. In the present invention, only a small amount of isopropyl alcohol 222a is introduced into the inner bath 212. Accordingly, it takes only a few seconds (four seconds in the present embodiment) to feed the heated isopropyl alcohol into the inner bath 212.

The liquid isopropyl alcohol 222 having passed through the flow control meter 260 is divided into two parts by the first supplying tube line 234a and the second supplying tube line 234b. Then the isopropyl alcohol 222 is heated by the first and second heaters 250a and 250b just before being introduced into the outer bath 216.

The heaters 250a and 250b heat the isopropyl alcohol to a temperature of 50° C. or so. The heated isopropyl alcohol liquid 222a spills from the outlets of the first and second receiving tube lines 234a and 234b onto the upper surface of the cleaning liquid 213.

The isopropyl alcohol liquid 222a thus quickly forms an isopropyl alcohol liquid layer 215 on the upper surface of the cleaning liquid 213, and is partially evaporated. The isopropyl alcohol vapor mixes with the nitrogen ambient in the upper portion of the outer bath 216. Roughly 10 seconds are required for forming the isopropyl alcohol liquid layer 215 (step S50).

After the heated liquid isopropyl alcohol 222a is supplied to the inner bath 212, the heated nitrogen gas is preferably supplied intermittently to the upper portion of the outer bath 216 via the nitrogen gas supply tube line 242.

Also, a separate isopropyl alcohol gas supply tube line may be connected to the upper portion of the outer bath 216. In this case, isopropyl alcohol vapor is introduced directly into the upper portion of the outer bath 216 while the nitrogen gas is being supplied via the nitrogen gas supply tube line 242. Alternatively, the line may be connected to the nitrogen gas supply tube line 242 so that isopropyl alcohol vapor is mixed with the nitrogen gas so that the isopropyl alcohol vapor is forced to fill the area between the outer bath 216 and the inner bath 212.

The area between the outer bath 216 and the inner bath 212 can alternatively be filled with isopropyl alcohol vapor by operating the first and second heaters 250a and 250b to heat the isopropyl alcohol liquid remaining in the first and second receiving tube lines 234a and 234b. By doing so, the heated liquid isopropyl alcohol is evaporated to produce isopropyl alcohol vapor 222b. The isopropyl alcohol vapor 222b exits the outlets of the first and second receiving tube lines 234a and 234b and expands into the upper portion of outer bath 216.

Thereafter (refer to FIG. 5C), a process of draining the cleaning liquid 213 is initiated (step S60). In this process, the pump 214P is turned on whereupon the cleaning liquid 213 is drawn through the second inner bath drain tube line 214c2 of the inner bath drain tube line 214c and into the common drain tube line 214d at a constant speed. If the cleaning liquid 213 were drained too fast, the isopropyl alcohol liquid layer 215 would break apart and the Marangoni effect would be lost. Draining the cleaning liquid too slowly is disadvantageous in terms of the efficiency of the cleaning process. Therefore, the pump 214P is operated to drain the cleaning liquid 213 at such a speed that the water level of the cleaning liquid 213 in the inner bath 216 drops by about 1.5 to 2.5 mm/sec. During the draining operation, the isopropyl alcohol layer 215 is maintained so that water spots on the wafers 201 are eliminated by the Marangoni effect.

Figure 5C:
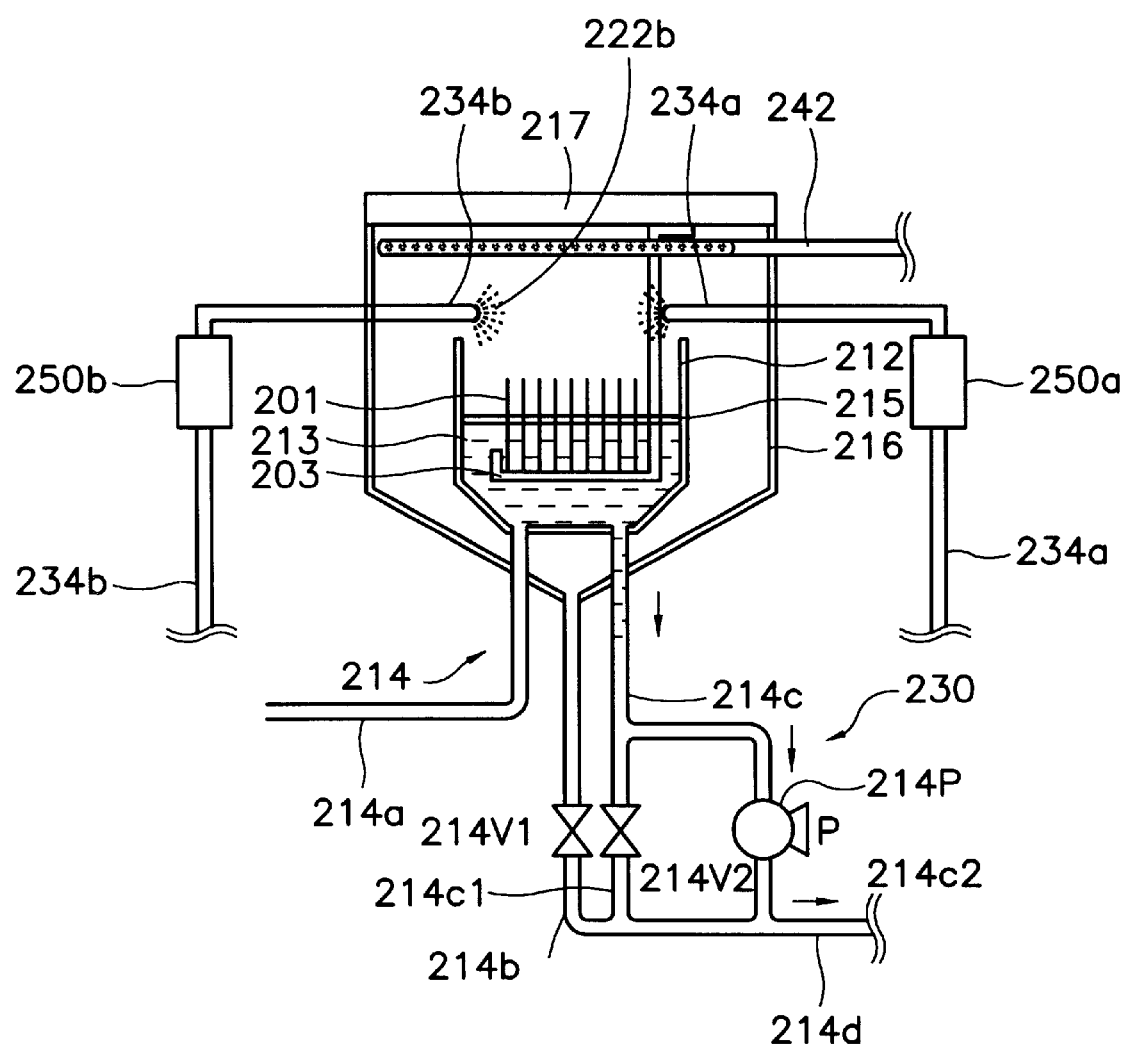
Figure 6:
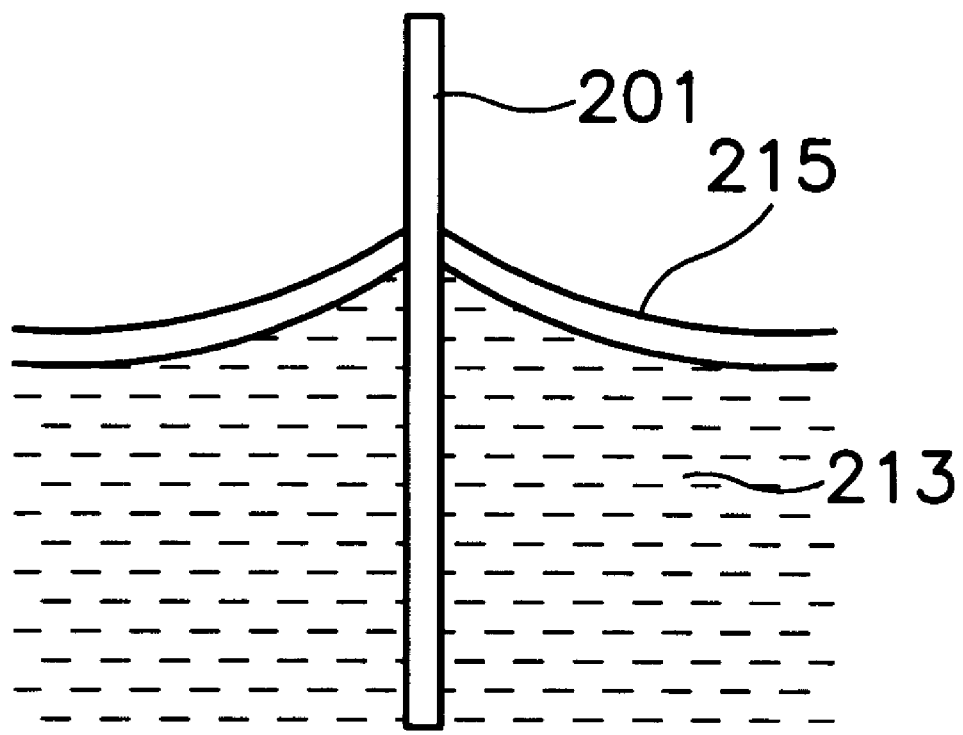
FIG. 6 is a schematic diagram showing the change in the level of cleaning liquid and an isopropyl alcohol layer, which occurs during the draining step shown in FIG. 5B.

FIG. 6 shows how the cleaning liquid 213 and the isopropyl alcohol layer 215 behave around the wafers 201 during the draining process illustrated in FIG. 5C. As the cleaning liquid 213 is gradually drained, portions of the cleaning liquid 213 and the isopropyl alcohol layer 215 closest to the wafers 201 remain adhered to the wafers at a level above the other portions of the cleaning liquid 213 and the isopropyl alcohol layer 21. Because the isopropyl alcohol has a surface tension that is smaller than that of the DIW, fluid flows from isopropyl alcohol layer 215 toward the cleaning liquid 213, thereby preventing the fluid from remaining on the wafers 201. Consequently, water spots will not form on the wafers 201 and hence, particles will not be left on the wafers 201 after the cleaning operation.

The isopropyl alcohol is preferably continuously heated while the cleaning liquid 213 is being drained so that isopropyl alcohol vapor is provided at the upper portion of the outer bath 216, i.e., over the cleaning liquid 213 and liquid isopropyl alcohol layer 215. This process stabilizes the isopropyl alcohol layer 215 on the cleaning liquid 213 as the cleaning liquid 213 is being drained. This, of course, enhances the cleaning effect.

Figure 5D:
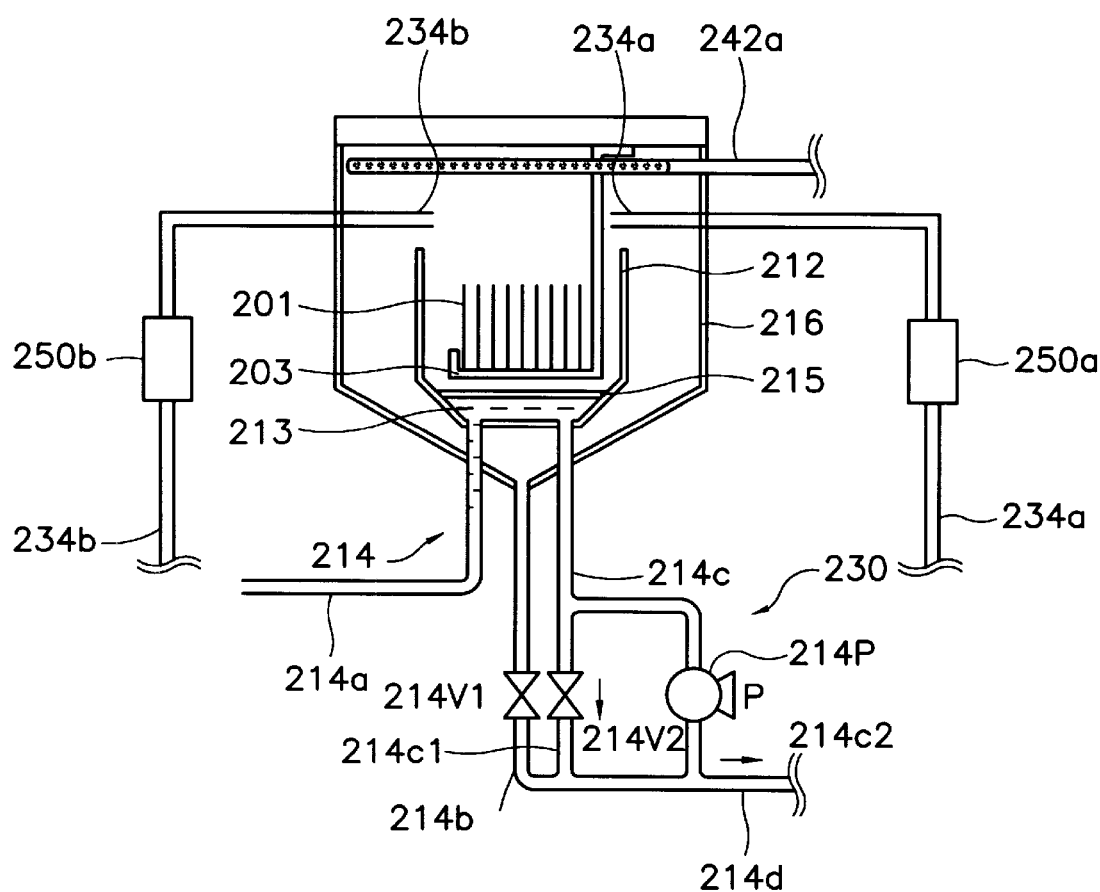

Referring now to FIG. 5D, the cleaning liquid 213 is drained for about 145~240 seconds. At some point in time (P1 in FIG. 8) in this process, when the level of the cleaning liquid 213 lies beneath the wafers 201, the first and second heaters 250a and 250b are turned off. Thus, the isopropyl alcohol vapor 222b is no longer supplied into the outer bath 216. Also, the supplying of the heated nitrogen gas is also stopped. Under this state, the second valve 214V2 disposed in the first inner bath drain tube line 214c1 may be open. However, the pump 214P in the second inner bath drain tube line 214c2 remains operating to thereby completely drain the cleaning liquid 213 from the inner bath 212.

Finally, the heated nitrogen gas is injected into the outer bath 216 via the nitrogen gas supply tube line 242 to complete the drying process. In this way, the lower peripheral portions of the wafers (that are the last portions to separate from the cleaning liquid) and any concave portions of the wafers, such as those defining contact holes, are dried. Once the drying process is complete, the wafer guide 203 loaded with the wafers 201 is pulled out of the cleaning bath 210 and is transferred to another apparatus.

Embodiment 2

Figure 12:
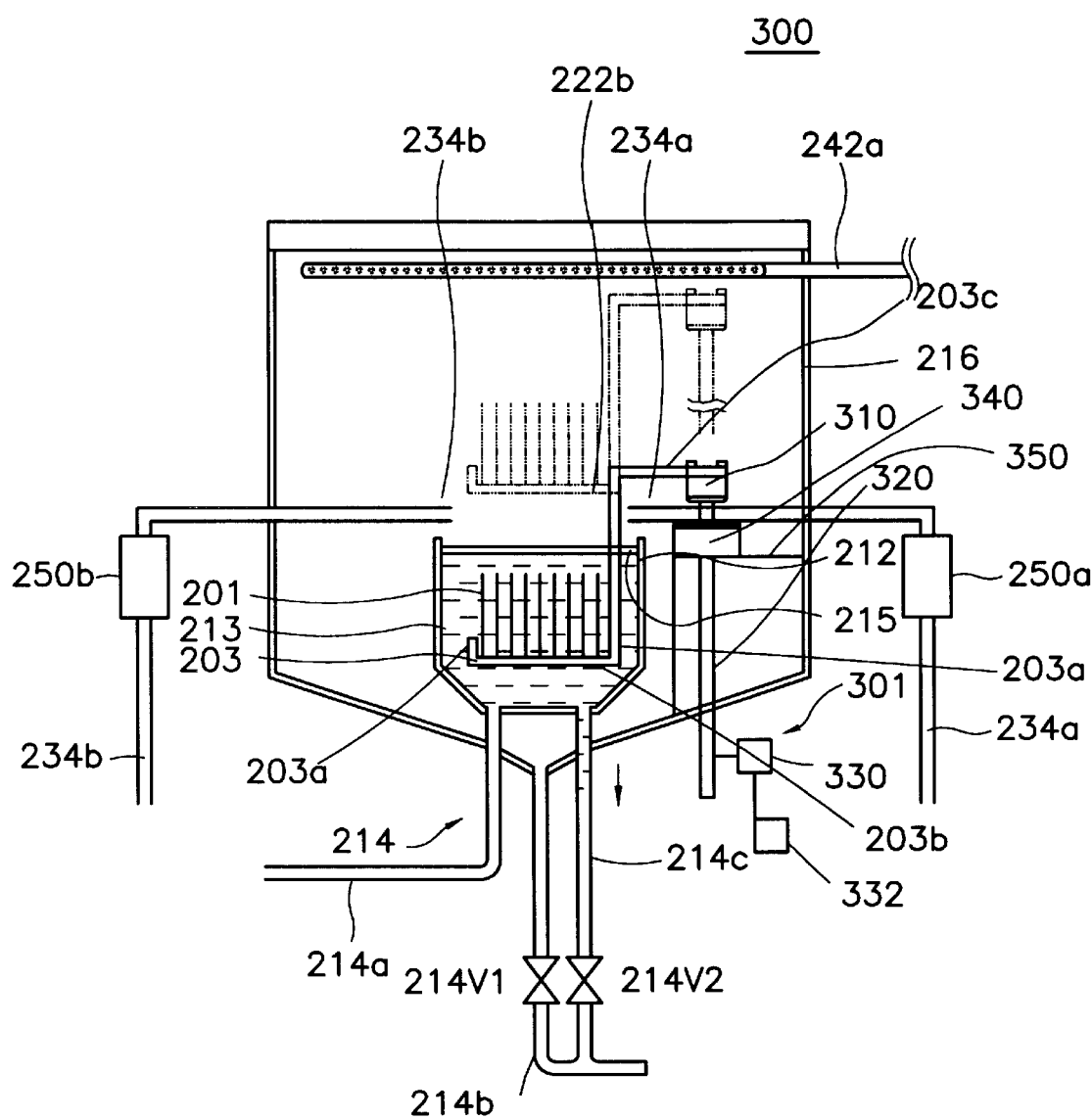
FIG. 12 is a schematic diagram of a second embodiment of an apparatus for drying a wafer according to the present invention.

FIG. 12 shows a second embodiment of a method of and an apparatus for drying a wafer according to the present invention.

This embodiment is similar to that of the first embodiment described with reference to FIGS. 3, 4 and 5A to 5D, except that in this embodiment, the wafers are raised to remove them from the cleaning liquid. Accordingly, parts similar to those of the first embodiment of the drying apparatus are designated by the same reference numerals.

Referring now to FIG. 12, the apparatus 300 for drying a wafer includes an outer bath draining unit comprising an outer bath drain tube line 214b connected to the outer bath 216 and a first drain tube valve 214V1 disposed in the drain tube line 214b. As in the first embodiment (refer to FIG. 5A), the cleaning liquid 213a over-flowing the inner bath 212 during the washing process gathers in the funnel-shaped lower portion of the outer bath 216. The cleaning liquid 213 is then drained from the outer bath 216 via the drain tube line 214b.

The apparatus 300 for drying a wafer also includes an inner bath draining unit an inner bath drain tube line 214c and a second drain valve 214V2 disposed in the inner bath drain tube line 214c. As described with reference to FIG. 5B, after the wafers 203 have been washed and prior to introducing the heated isopropyl alcohol 222a onto the surface of the cleaning liquid 213, the second drain valve 214V2 is opened to drain some of the cleaning liquid 213 from the inner bath. Specifically, the cleaning liquid is drained until the level thereof in the inner bath 216 drops by approximately 5 mm.

The drying apparatus 300 further includes a wafer elevating unit 301 for raising the wafers 201. The wafer elevating unit 301 comprises a support stand 350, a piston support unit 340, a power transfer mechanism 330, a piston shaft 320, and a coupling unit 310. The support stand 350 is disposed to one side of the lower portion of the outer bath 216. The piston support unit 340 has central through-hole and is fixed to the support stand 340. The piston shaft 320 extends freely through the through-hole of the piston support unit 340 so as to be capable of reciprocating. The coupling unit 310 couples the upper end of the piston shaft 320 and the wafer guide arm 203c. The piston shaft 320 coupled to the wafer guide arm 203c moves the wafer guide 203 up and down to immerse the wafers 201 in the cleaning liquid 213 and to raise them out of the cleaning liquid 213.

The piston shaft 320 is connected to a power generating unit 332, such as a motor, via the power transfer mechanism 330. The power transfer mechanism 330 may be a gear box, or a belt and pulley system configured to transmit the rotary output of the power transferring unit 332 to the piston shaft 320 as rectilinear motion. The power transfer mechanism 330 thus can move the piston shaft 320 vertically in either direction.

The method of drying the wafers will now be described with reference to FIG. 13.

The wafer guide 203 loaded with the wafers 201 is placed within the inner bath 212. Then, the cleaning liquid 213, such as DIW, is fed into the inner bath 212 via the cleaning liquid supply tube line 214a to start the washing process (step S110). The washing process is identical to that described with respect to step S10 of FIGS. 7 and 8.

Once the process of washing the wafers 201 is complete, the process of drying the wafers 201 begins. First, nitrogen gas is supplied into the outer bath 216 for producing a drying ambient (step S120 in FIG. 13). This process is identical to that described with respect to step S20 of FIGS. 7 and 8.

Thereafter, the second drain valve 214V2 is opened for a short period of time to drain the cleaning liquid 213 from the inner bath 212 and thereby reduce the level of the cleaning liquid 213 in the inner bath 212 slightly (step S130). This process is identical to that described with respect to step S30 of FIGS. 7 and 8.

Next, heated liquid isopropyl alcohol 222a is supplied from the isopropyl alcohol supplying unit 220 into the inner bath 212 via the isopropyl supply tube line 234 (step S140). This process is identical to that described with respect to step S40 of FIGS. 7 and 8.

The heated isopropyl alcohol liquid 222a quickly forms a liquid isopropyl alcohol layer 215 on the surface of the cleaning liquid 213, and at the same time partially evaporates to form an isopropyl alcohol ambient in the upper portion of outer bath 216 (step S150). This process is identical to that described with respect to step S50 of FIGS. 7 and 8.

Thereafter, nitrogen gas is supplied to the upper portion of the outer bath 216 via the nitrogen gas supply tube line 242. At the same time, the power generating unit 332 is supplied with electric power. The output of the power generating unit 332 is transmitted to the piston shaft 320 as rectilinear motion via the power transfer mechanism 330, to thereby raise the piston shaft 320. The wafer guide 203 loaded with the wafers 201 is thus raised until the wafers 201 are removed from the cleaning liquid 213 (step S160). At this time, the wafer elevating unit is preferably operated to raise the wafers at a speed of 1.5~2.5 mm/sec as in step S60.

As denoted by the dashed lines of FIG. 12, the wafers 201 are completely removed from the cleaning liquid 213. Then, the first and second heaters 250a and 250b are turned off and the supplying of the isopropyl alcohol vapor 222b ceases. Also, the supplying of the heated nitrogen ceases. Under this state, the second drain valve 214V2 is opened to thoroughly drain the cleaning liquid 213 from the inner bath 212. Thereafter, the heated nitrogen gas is introduced into the outer bath 216 via the nitrogen gas supply tube line 242 to complete the drying process (step S170). After the drying process is completed, the wafer guide 203 loaded with the wafers 201 is transferred from the outer bath 216 to another processing apparatus.

Experiment 1

Ten lots of the wafers (one lot consists of 24 wafers) were dried according to the method shown in FIG. 8 using the first embodiment of the wafer drying apparatus shown in FIG. 3.

Referring again to FIG. 8, the wafers 201 were washed for 300 seconds using DIW as the cleaning liquid. The heater 244 was then operated at about 150° C. to heat the nitrogen gas to about 70~90° C. The heated nitrogen gas was supplied to the upper portion of the outer bath 216 via the nitrogen gas supply tube line 242 for 60 seconds and at a pressure of 3 kg/cm$^2$. Thereafter, the second drain valve 214V2 in the first inner bath drain tube line 214c1 was opened to lower the level of the cleaning liquid 213 in the inner bath 212 by as much as 5 mm. Then, the second drain valve 214V2 was closed, and the first and second heaters 250a and 250b were set at 70° C. Subsequently, about 30 ml of the heated isopropyl alcohol liquid 222a was supplied via the first and second isopropyl alcohol supply tube lines 234a and 234b. This process took 4 seconds to complete. The isopropyl alcohol liquid layer 215 formed on the surface of the cleaning liquid 213 as a result had a thickness of about 2.1 mm.

Then, the heated nitrogen gas was supplied into the upper portion of the outer bath 216 while the first and second heaters 250a and 250b were operated to produce the isopropyl alcohol vapor 222b. After roughly 10 seconds, the cleaning liquid 213 was drained from the inner bath 212 at a rate of 2 mm/sec using the pump 214P disposed in the second inner bath drain tube line 214c2. This draining process was carried out for about 145 seconds or 240 seconds until the level of the cleaning liquid 213 in the inner bath 212 sank below the wafers 201. At this point in time, the first and second heaters 250a and 250b were turned off. Also, the supplying of the heated nitrogen gas was ceased, and the second drain valve 214V2 disposed in the second inner bath drain tube line 214c2 was opened to thoroughly drain the remaining cleaning liquid 213 and the isopropyl alcohol liquid layer 215 from the inner bath 212. Finally, the heated nitrogen gas was supplied into the outer bath for 300 seconds to dry the wafers 201 completely.

The number of particles having a diameter of at least 0.12 μm on the wafer prior to the washing operation was compared to that after the washing and drying operation. Three wafers were sampled from each lot of 24 wafers, one each from the front, center and rear of the lot. Ten lots of the wafers were tested in total.

Figure 9:
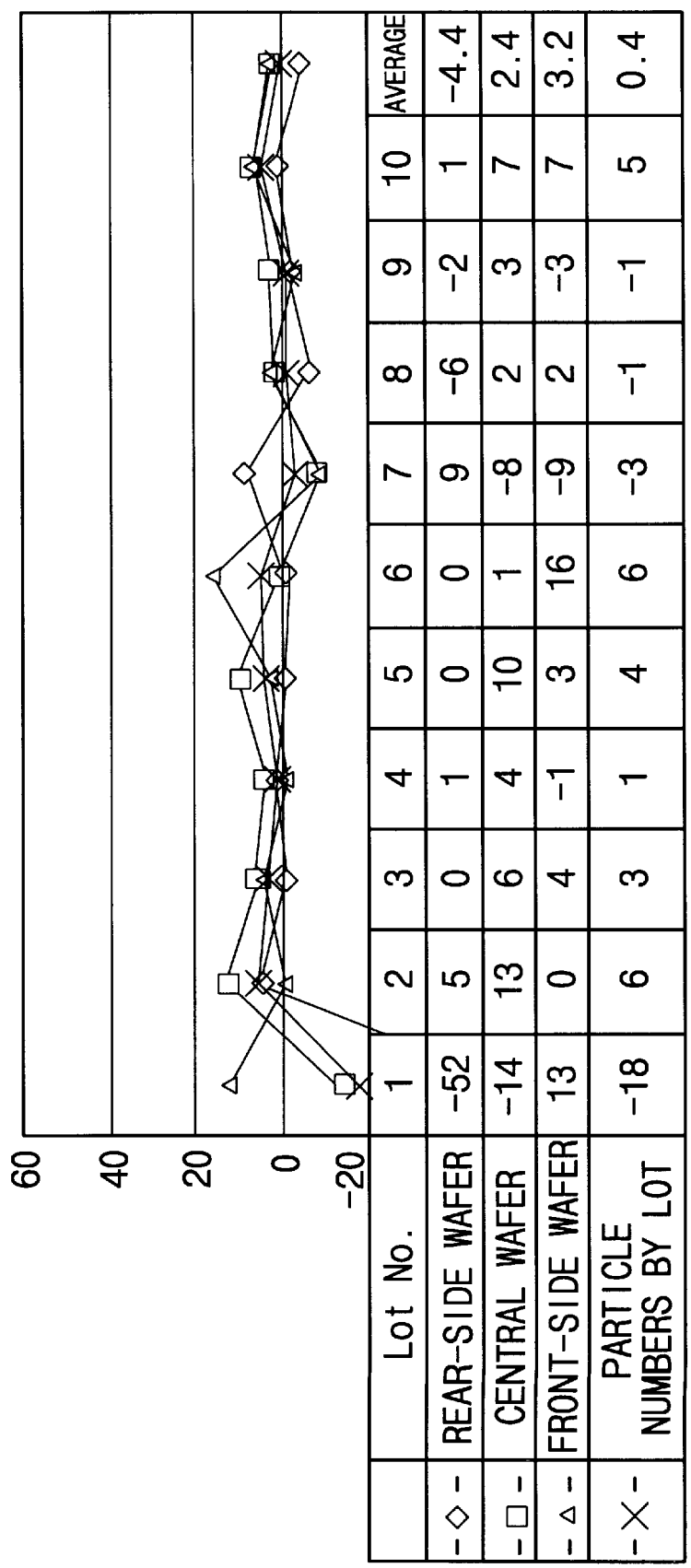
FIG. 9 is a graph plotting the change in the number of particles before and after a wafer is washed and dried in accordance with the method of the present invention.

FIG. 9 shows the change in the number of particles before and after the cleaning operation for the sampled wafers of the ten lots. In FIG. 9, a negative (−) number denotes a decreased number of particles and a positive (+) number denotes an increased number of particles. Also, in FIG. 9, the plot using the diamond-shaped symbol is a result from the wafers sampled at the rear of the wafer guide, the plot using a square-shaped symbol is a result from the wafers sampled at the center portion of the wafer guide, and the plot using triangle-shaped symbol is a result from the wafers sampled at the front of the wafer guide. The graph plotted using the character X is the average result from the sampled wafers. The change in the number of particles before and after the cleaning of the wafers at the rear of the wafer guide was −4.4 on average, that at the center of the wafer guide was 2.4 on average, and that at the rear of the wafer guide was 3.2 on average. The average change in the number of particles of all of the sampled wafers was 0.4.

These results show that the drying process according the present invention hardly leaves any particles that are the result of water spots. Furthermore, there is little variation in the change in the number of particles over the different positions that the wafers occupy in the bath. Accordingly, the drying process according to the present invention is remarkably uniform and effective.

Experiments 2, 3 and 4

In Experiment 2, the isopropyl alcohol liquid was employed at room temperature instead of being heated. In Experiment 3, the nitrogen gas was introduced into the outer bath at room temperature instead of being heated. In Experiment 4, the isopropyl alcohol liquid was employed at room temperature instead of being heated, and was introduced into the outer bath at room temperature instead of being heated. Otherwise, the cleaning and drying operations were conducted in the same manner as with Experiment 1. And, as with Experiment 1, the wafers were examined for changes in the number of particles having a diameter of at least 0.12 μm before and after the washing and drying operations.

The results of these first to fourth experiments are qualified below in Table 1.

TABLE 1

| | IPA liquid | Nitrogen gas | Variation of number of particles | Evaluation |
| --- | --- | --- | --- | --- |
| Experiment 1 | Heated | Heated | Varied very little at all | Excellent |
| Experiment 2 | Unheated | Heated | Varied severely | Poor |
| Experiment 3 | Heated | Unheated | Varied slightly | Good |
| Experiment 4 | Unheated | Unheated | Varied highly | Poor |

As shown in Table 1, when the isopropyl alcohol was heated to form the isopropyl alcohol liquid layer on the cleaning liquid, as in Experiments 1 and 3, the drying effect was favorable. However, when the isopropyl alcohol liquid was injected at room temperature, as in Experiments 2 and 4, too many particles were left after the drying operation.

Moreover, when the nitrogen gas was injected without being heated, as in Experiment 3, not enough isopropyl alcohol vapor was produced in the ambient above the cleaning liquid. This resulted in a much greater variation in the number of particles as compared with Experiment 1 in which the heated nitrogen gas was used.

Although the isopropyl alcohol liquid was introduced at room temperature without being heated in both Experiments 2 and 4, Experiment 2, in which the heated nitrogen gas was used, showed a smaller variation in the number of particles than Experiment 4 in which the unheated nitrogen gas was used. And, although the heated isopropyl alcohol liquid was used in both Experiments 1 and 3, Experiment 3, in which the unheated nitrogen gas was used, showed a greater variation in the number of particles than Experiment 1 in which the heated nitrogen gas was used. From these observations, it is clear that the drying effect is improved by using the heated nitrogen gas. Apparently, the isopropyl alcohol is evaporated somewhat by the heated nitrogen gas to ensure that the isopropyl alcohol vapor is present throughout the nitrogen gas ambient formed over the upper portion of the cleaning liquid.

Experiment 5

Experiment 5 was conducted to provide a comparison of the conventional wafer drying method and that according to the present invention in terms of the variation in the number of particles on the wafers.

Figure 1:
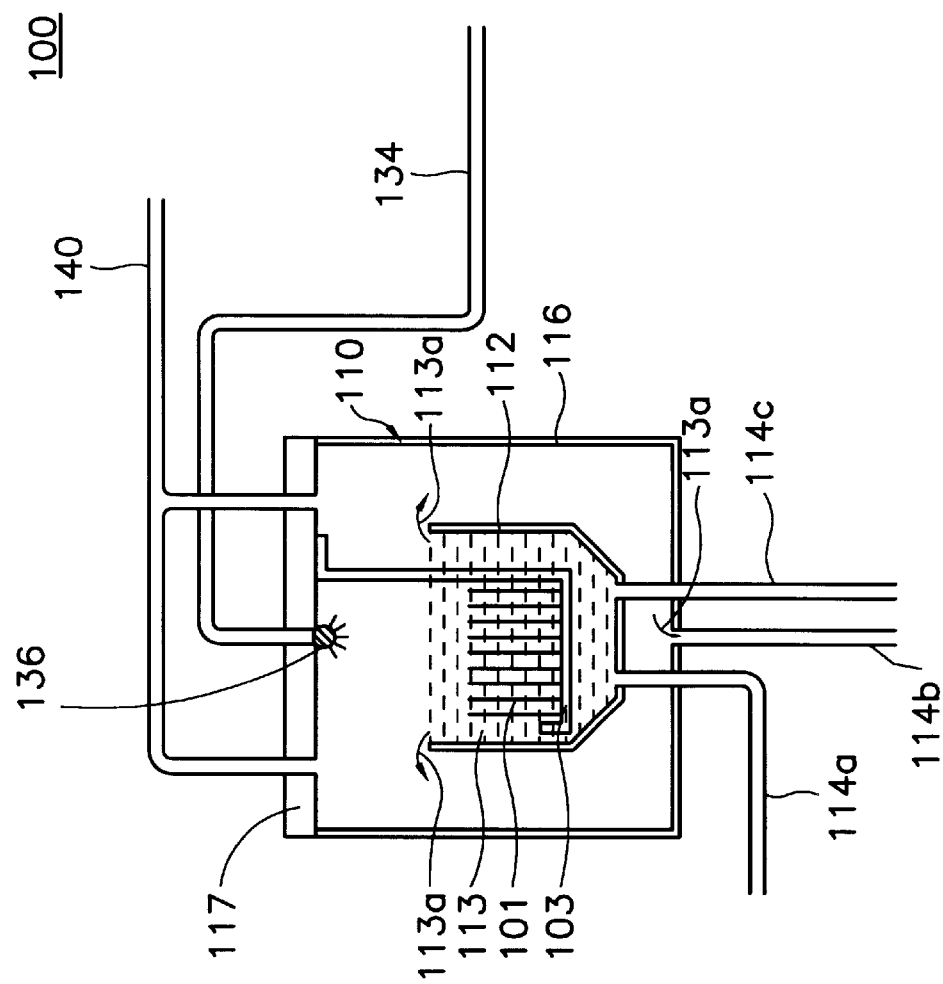
FIG. 1 is a schematic diagram of a conventional apparatus for drying a wafer.
Figure 2A:
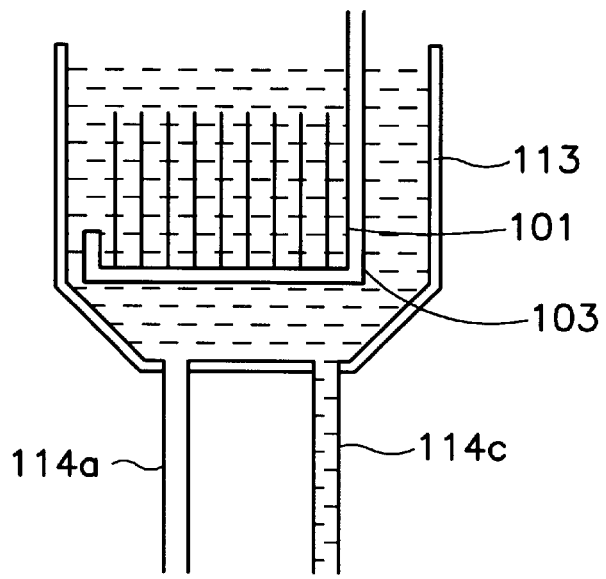
Figure 2B:
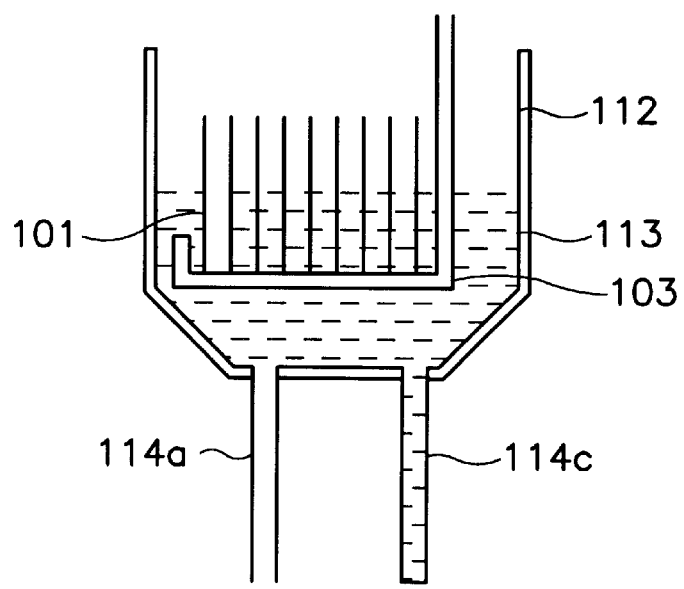
Figure 10:
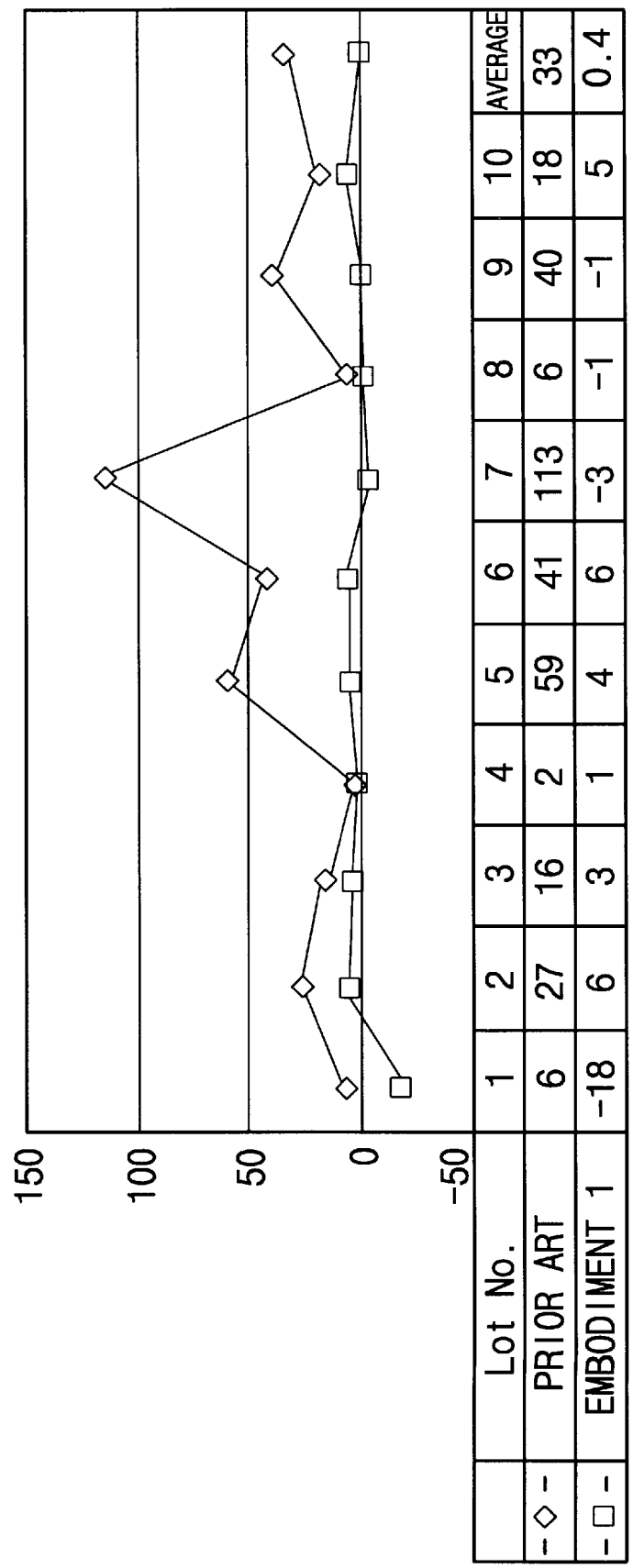
FIG. 10 is a graph plotting the change in the number of particles before and after a wafer is washed and dried in accordance with the method of the present invention, using the average values from FIG. 9, and in accordance with a prior art process.

More specifically, the conventional cleaning and drying apparatus shown in FIG. 1 was used to perform a cleaning operation, an apparatus of the present invention was used to perform the cleaning operation shown in FIG. 8, and the number of particles having a diameter of at least 0.16 μm on the wafers was checked before and after the cleaning operations. FIG. 10 is a graph of the results. In FIG. 10, the plot using the square-shaped symbol is the average result of examining lots of the wafers cleaned according to the present invention, and the plot using the diamond-shaped symbol is the average result of examining wafers cleaned using the conventional apparatus of FIG. 1.

As can be seen from FIG. 10, when the conventional wafer drying process is executed, the variation in the number of particles before and after the process was 33 on average. This means that, on average, the process performed by the conventional apparatus left 33 particles having a diameter of at least of 0.16 μm on a wafer. On the other hand, the cleaning process performed according to the present invention left only a negligible number of particles having a diameter of at least 0.12 μm.

Experiment 6

Experiment 6 was conducted to determine how the quantity of the isopropyl alcohol liquid affects the number of particles left on the wafers.

Figure 11:
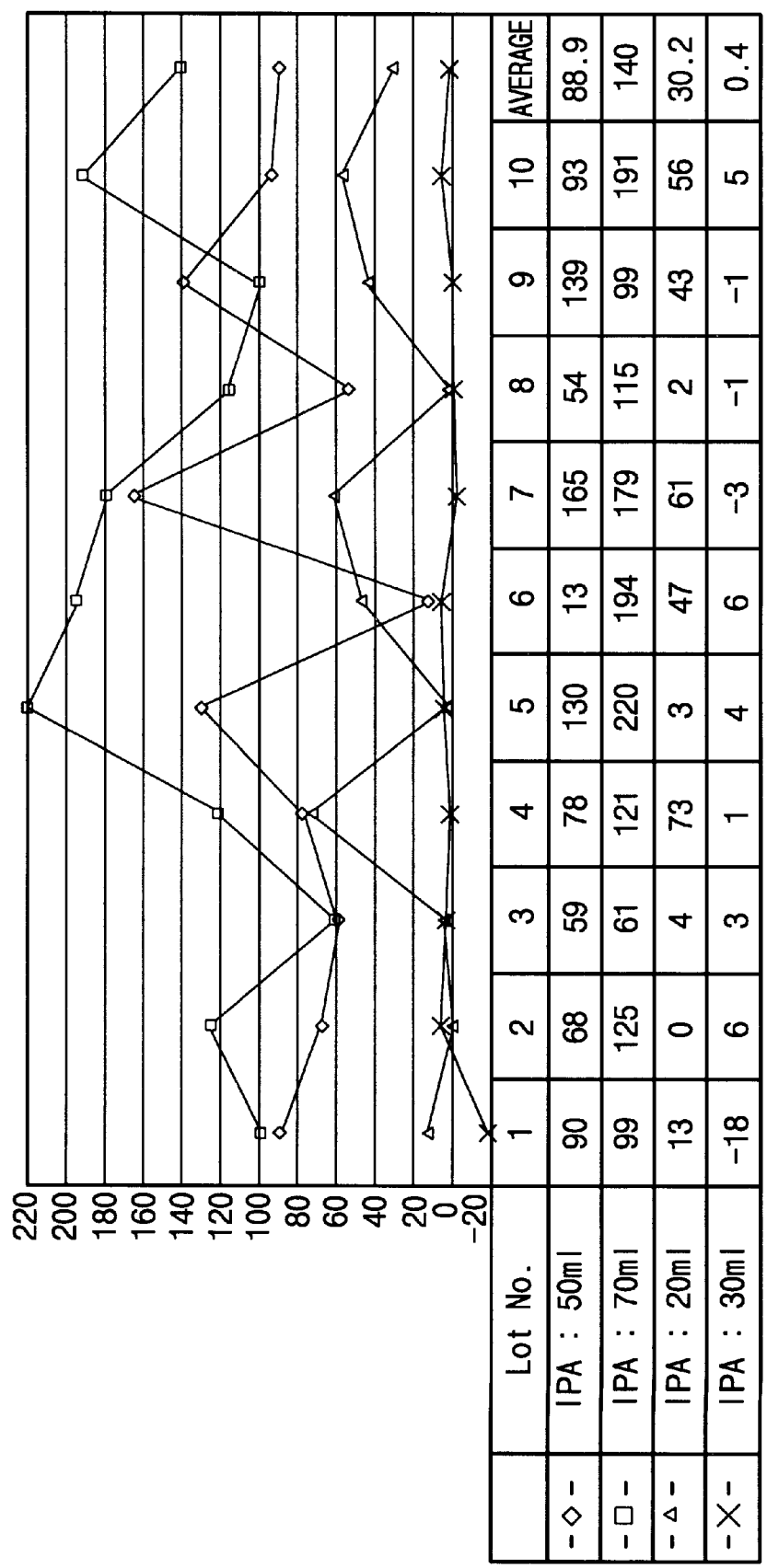
FIG. 11 is a graph plotting the number of particles before and after a wafer is washed and dried for different amounts of supplied isopropyl alcohol.

In this experiment, tests were performed in which 20 ml, 30 ml, 50 ml and 70 ml each of the isopropyl alcohol liquid was supplied to the inner bath. Otherwise, the processes were conducted according to that shown in FIG. 8. The inner bath was 40 cm long by 35 cm wide. Thus, the isopropyl alcohol liquid layers formed on the cleaning liquid were approximately 5 mm, 3.6 mm, 2.1 mm and 1.4 mm thick, respectively. The variation in the number of particles having a diameter of at least 0.12 μm before and after the processes was measured. The results of these measurements are shown in FIG. 11.

The number of particles increased by 140, 88.9 and 30.2 on average, when the amounts of isopropyl alcohol liquid supplied were 70 ml, 50 ml and 20 ml, respectively. However, the number of particles increased by only 0.4, on average, when 30 ml of the isopropyl alcohol was supplied to the inner bath. This experiment showed that the amount of isopropyl alcohol liquid supplied needs to be carefully regulated.

In fact, these tests revealed that the isopropyl alcohol liquid layer must have a thickness of about 1 mm to 3 mm if a satisfactory limit on the particles left by water spots after the cleaning process is to be met. The preferred thickness of the isopropyl alcohol liquid layer is 1.5~2.5 mm, and more preferably at least 2 mm and no more than 2.5 mm.

According to the present invention, in the process of drying a wafer using the Marangoni effect, heated liquid isopropyl alcohol is supplied onto the surface of the cleaning liquid. The isopropyl alcohol diffuses quickly to form an isopropyl liquid layer. Therefore, as compared with the conventional method in which the isopropyl alcohol liquid layer is formed by an isopropyl alcohol mist carried in nitrogen gas, the present invention is more efficient.

Furthermore, in the conventional process, it is difficult to regulate the amount of isopropyl alcohol being supplied because the isopropyl alcohol is supplied as a mist through the use of the carrier nitrogen gas. Thus, it is difficult to optimize the process while it is being carried out. However, in the present invention, the isopropyl alcohol is supplied in a liquid state. Therefore, the exactly quantity of isopropyl alcohol required to prevent the forming of water spots that leave too many particles on the waters can be supplied.

Although the present invention has been shown and described with reference to particular embodiments thereof, various changes in form and details may be effected therein without departing from the true spirit and scope of the invention as defined by the appended claims.

What is claimed is:

1. A method of drying an object of manufacture after the object has been washed by being immersed in a cleaning liquid, said method comprising the steps of:

while the object is submerged in the cleaning liquid, supplying inert gas over the cleaning liquid, and heating the inert gas, whereby an ambient of the heated inert gas is produced over the cleaning liquid;

while the object remains submerged in the cleaning liquid, heating a liquid having a smaller surface tension than that of said cleaning liquid to such a temperature, and supplying the heated liquid onto the surface of said cleaning liquid in a fluid state in such an amount that a stable layer consisting of the heated liquid is formed on the surface of the cleaning liquid and vapor of the heated liquid mixes with the inert gas to form an ambient comprising a mixture of the vapor and the heated inert gas over the cleaning liquid;

subsequently removing the object from said cleaning liquid through the layer of said heated liquid and into the ambient over said cleaning liquid; and while the object is exposed to the ambient, supplying additional heated inert gas into the ambient, wherein the step of supplying the heated liquid onto the surface of the cleaning liquid is carried out until the liquid layer of liquid has a thickness within a range of about 1 mm to about 3 mm.

2. A method of drying an object as claimed in claim 1, wherein the inert gas is nitrogen.

3. A method of drying an object as claimed in claim 1, wherein the cleaning liquid is de-ionized water and the heated liquid is isopropyl alcohol.

4. A method of drying an object of manufacture after the object has been washed by being immersed in a cleaning liquid, said method comprising the steps of:

supplying heated nitrogen gas over the cleaning liquid in which the object is submerged;

while the object remains submerged in the cleaning liquid, supplying a predetermined quantity of heated liquid isopropyl alcohol onto the cleaning liquid sufficient to form an isopropyl alcohol layer on the cleaning liquid and an ambient comprising a mixture of the isopropyl alcohol and the heated nitrogen gas over said cleaning liquid;

removing the object from the cleaning liquid through the layer of isopropyl alcohol and into the ambient to thereby dry the object; and while the object is exposed to the ambient, supplying additional heated nitrogen gas into the ambient to thereby further dry the object, wherein the liquid isopropyl alcohol is supplied until the layer thereof on the cleaning liquid has a thickness in the range of about 1 mm to about 3 mm.

5. A method of drying an object as claimed in claim 4, and further comprising the step of supplying additional heated nitrogen gas into the ambient above the cleaning liquid immediately after the predetermined quantity of the liquid isopropyl alcohol has been supplied onto the cleaning liquid.

6. A method for drying an object as claimed in claim 5, wherein the step of supplying additional heated nitrogen gas comprises supplying heated nitrogen gas into the ambient continuously during the entire time the object is being removed from the cleaning liquid.

7. A method of drying an object as claimed in claim 4, and further comprising the step of draining only some of cleaning liquid from around the object while keeping the object immersed in the cleaning liquid, before the heated liquid isopropyl alcohol is supplied onto the cleaning liquid.

8. A method of drying an object as claimed in claim 4, and further comprising the step of supplying isopropyl alcohol vapor into the ambient over the cleaning liquid after the heated liquid isopropyl alcohol is supplied onto the cleaning liquid, in addition to the vapor that is derived from the layer of isopropyl alcohol on the cleaning liquid.

9. A method of drying an object as claimed in claim 8, wherein the step of supplying the additional isopropyl alcohol vapor comprises supplying isopropyl alcohol vapor continuously during the entire time the object is being removed from the cleaning liquid.

10. A method of drying an object as claimed in claim 4, wherein the step of removing the object from the cleaning liquid comprises draining the cleaning liquid from around the object until the object becomes exposed to the ambient.

11. A method of drying an object as claimed in claim 10, wherein the draining of the cleaning liquid is carried out at such a rate that the level of the cleaning liquid drops at about 1.5 mm/sec to about 2.5 mm/sec.

12. A method of drying an object as claimed in claim 4, wherein the step of removing the object from the cleaning liquid comprises raising the object up out of the cleaning liquid.

13. A method of drying an object as claimed in claim 4, wherein the cleaning liquid comprises de-ionized water.

14. A method of drying an object as claimed in claim 4, wherein the supplying of heated nitrogen gas comprises supplying nitrogen gas having a temperature within the range of 70° C. to about 90° C. over the cleaning liquid.

* * * * *